(12) United States Patent
Yang et al.

(10) Patent No.: US 11,935,910 B2
(45) Date of Patent: Mar. 19, 2024

(54) SEMICONDUCTOR LIGHT-EMITTING DEVICE WITH GROOVE AND METHOD OF MANUFACTURING THE SAME

(71) Applicant: SAMSUNG ELECTRONICS CO., LTD., Suwon-si (KR)

(72) Inventors: Jongin Yang, Hwaseong-si (KR); Joosung Kim, Seongnam-si (KR); Donggun Lee, Hwaseong-si (KR); Suhyun Jo, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 470 days.

(21) Appl. No.: 17/027,960

(22) Filed: Sep. 22, 2020

(65) Prior Publication Data

US 2021/0249466 A1 Aug. 12, 2021

(30) Foreign Application Priority Data

Feb. 12, 2020 (KR) ........................ 10-2020-0017146

(51) Int. Cl.
*H01L 29/20* (2006.01)
*H01L 27/15* (2006.01)
(Continued)

(52) U.S. Cl.
CPC ........ *H01L 27/156* (2013.01); *H01L 33/0093* (2020.05); *H01L 33/405* (2013.01);
(Continued)

(58) Field of Classification Search
CPC . H01L 27/156; H01L 33/0093; H01L 33/405; H01L 33/42; H01L 33/505;
(Continued)

(56) References Cited

U.S. PATENT DOCUMENTS 6,372,608 B1 4/2002 Shimoda et al.
6,645,830 B2 11/2003 Shimoda et al.
(Continued)

FOREIGN PATENT DOCUMENTS

CN 104465691 A 3/2015
JP 2006-196572 A 7/2006
(Continued)

*Primary Examiner* — Ismail A Muse
(74) *Attorney, Agent, or Firm* — Fish & Richardson P.C.

(57) ABSTRACT

Provided is a semiconductor light-emitting device including a substrate, a first insulating layer disposed on an upper surface of the substrate, a plurality of light-emitting structures disposed on the first insulating layer and spaced apart from each other, each of the plurality of light-emitting structures including a first semiconductor layer, an active layer, and a second semiconductor layer, a plurality of optical layers each filling a groove that is formed at a certain depth in the second semiconductor layer, a plurality of first electrodes penetrating the substrate and electrically connected to the first semiconductor layer, a plurality of second insulating layers disposed on side surfaces of each of the plurality of light-emitting structures, respectively, and a second electrode connected to the plurality of light-emitting structures, the second electrode being disposed on an uppermost surface of the second semiconductor layer and each of the plurality of second insulating layers.

21 Claims, 25 Drawing Sheets

(51) Int. Cl.
*H01L 33/00* (2010.01)
*H01L 33/40* (2010.01)
*H01L 33/42* (2010.01)
*H01L 33/50* (2010.01)

(52) U.S. Cl.
CPC ............ *H01L 33/42* (2013.01); *H01L 33/505* (2013.01); *H01L 2933/0016* (2013.01); *H01L 2933/0041* (2013.01)

(58) Field of Classification Search
CPC ..... H01L 2933/0016; H01L 2933/0041; H01L 25/0753; H01L 33/504; H01L 33/38; H01L 33/005; H01L 33/24; H01L 33/483; H01L 33/62
See application file for complete search history.

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,745,832 B2 | 6/2010 | Hsieh et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 * | 3/2013 | Kwak | H01L 33/007 257/89 |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 8,969,900 B2 | 3/2015 | Sabathil et al. | |
| 9,159,874 B2 | 10/2015 | Kim et al. | |
| 9,608,168 B2 | 3/2017 | Chae | |
| 10,388,693 B2 * | 8/2019 | Cha | H01L 33/62 |
| 2009/0267092 A1 * | 10/2009 | Fukshima | H01L 33/20 257/E33.068 |
| 2012/0161185 A1 | 6/2012 | Wang | |
| 2018/0166424 A1 * | 6/2018 | Sim | H01L 33/483 |
| 2019/0252576 A1 * | 8/2019 | Lee | H01L 25/0753 |
| 2020/0152694 A1 * | 5/2020 | Lee | H01L 33/50 |
| 2020/0212267 A1 * | 7/2020 | Kwak | H01L 33/24 |
| 2020/0212268 A1 * | 7/2020 | Choi | H01L 33/24 |
| 2020/0251524 A1 * | 8/2020 | Saito | H01L 33/30 |
| 2020/0303676 A1 * | 9/2020 | Lin | H10K 50/852 |
| 2021/0366982 A1 * | 11/2021 | Lee | H01L 27/156 |
| 2021/0367121 A1 * | 11/2021 | Kim | H01L 27/156 |

FOREIGN PATENT DOCUMENTS

| | | |
|---|---|---|
| JP | 2007-059418 A | 3/2007 |
| JP | 4193471 B2 | 12/2008 |
| KR | 10-2013-0046286 A | 5/2013 |
| KR | 10-1291153 B1 | 7/2013 |
| KR | 10-1956066 B1 | 3/2019 |

* cited by examiner

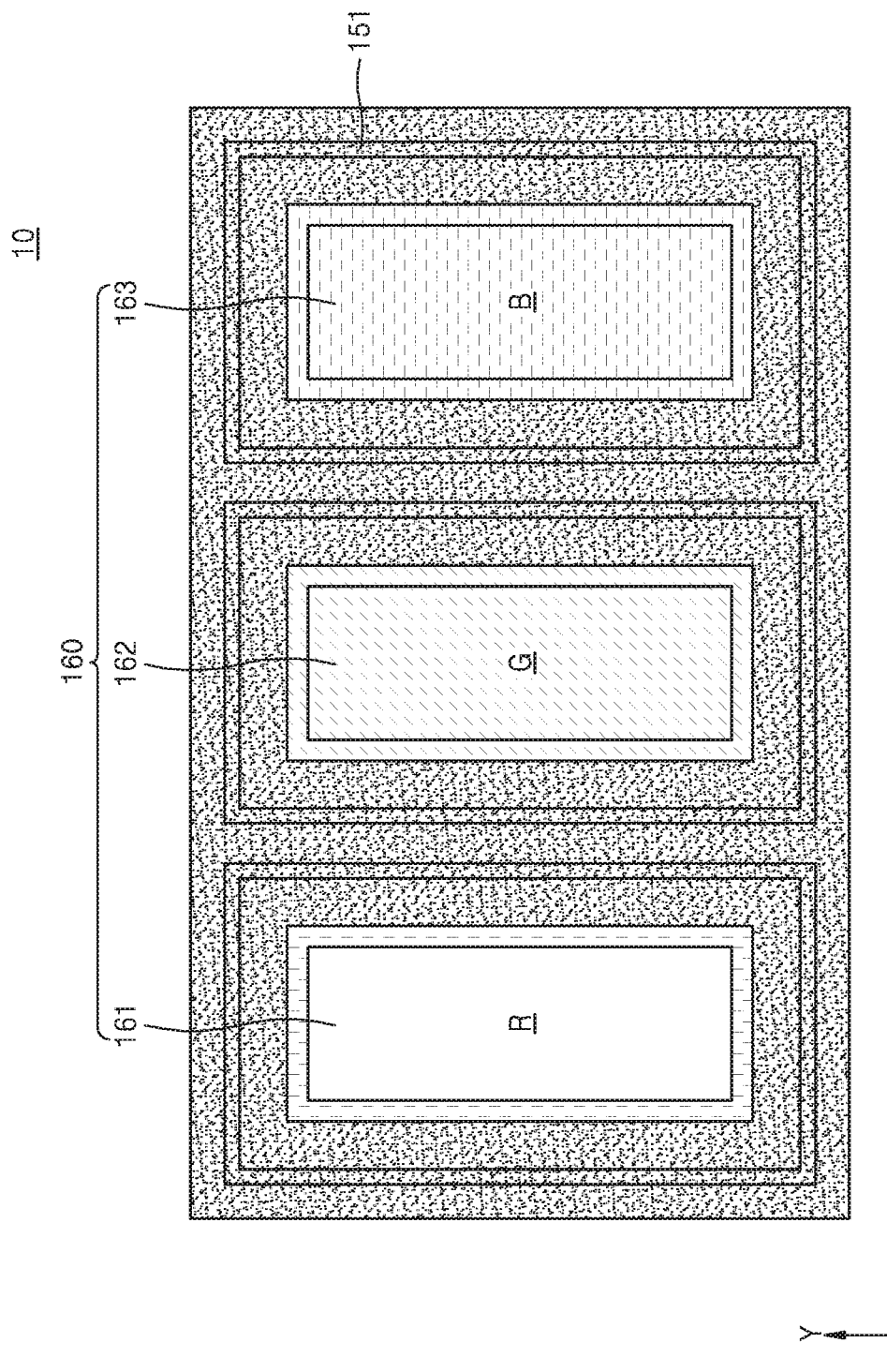

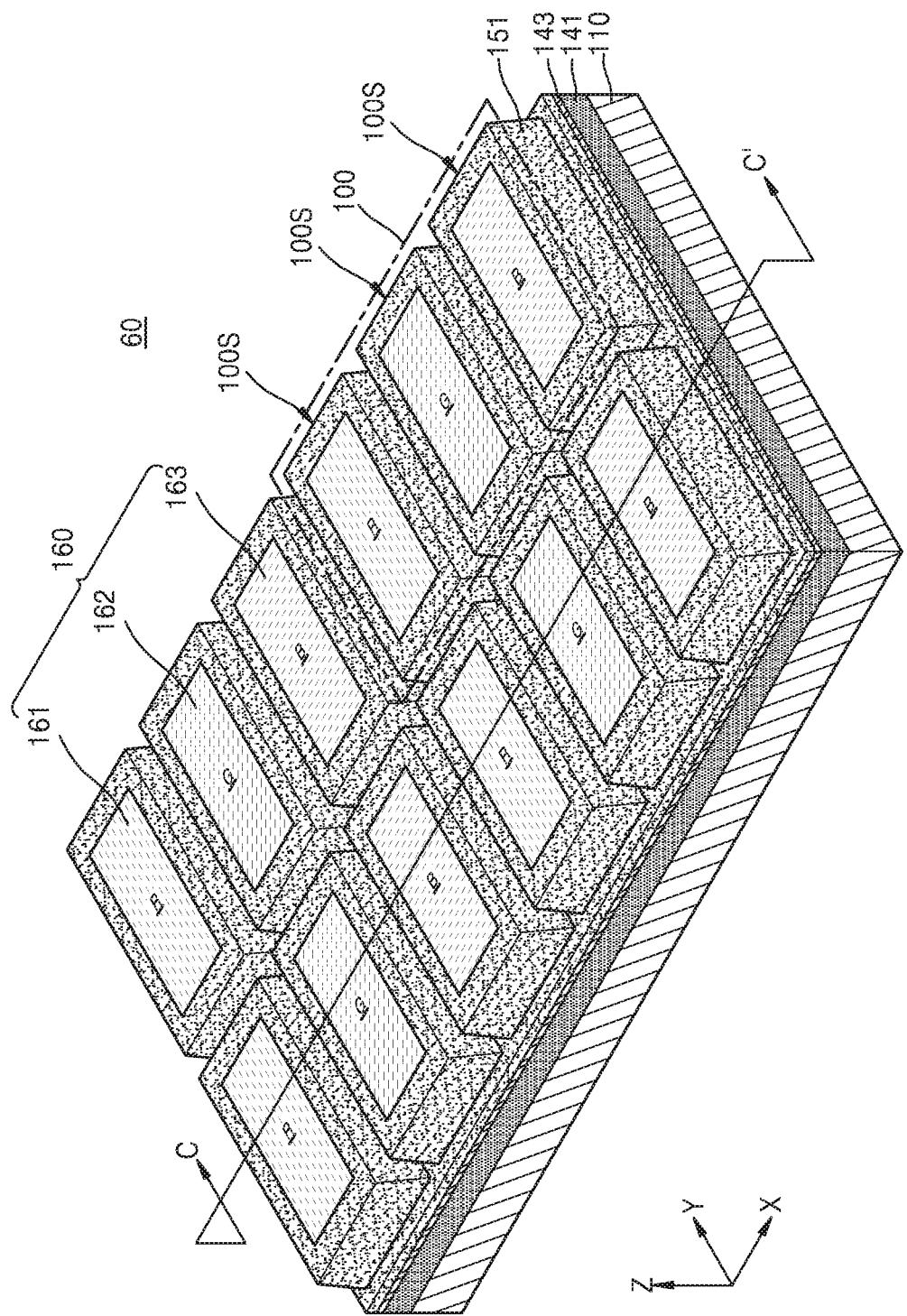

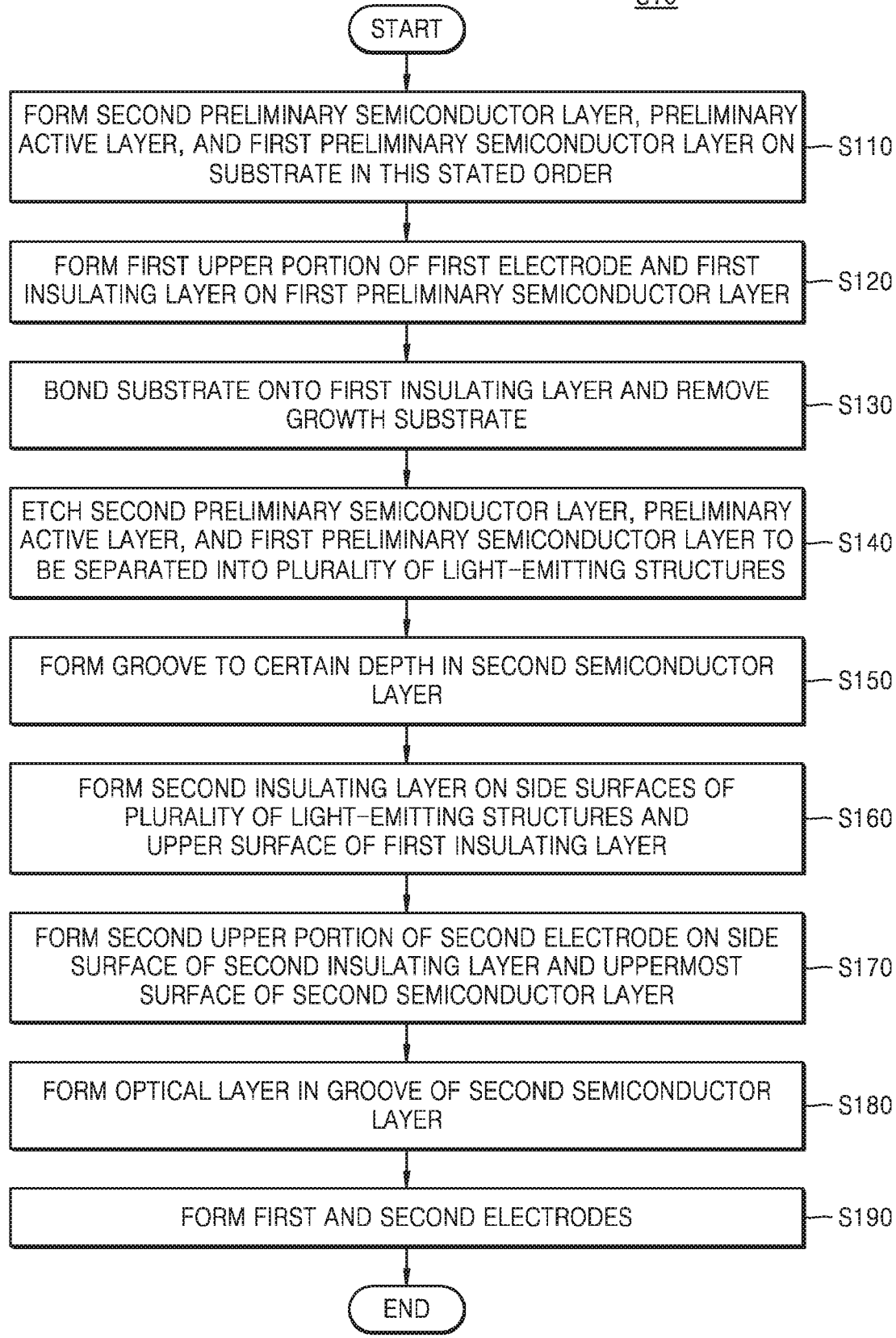

SEMICONDUCTOR LIGHT-EMITTING DEVICE WITH GROOVE AND METHOD OF MANUFACTURING THE SAME

CROSS-REFERENCE TO THE RELATED APPLICATION

This application is based on and claims priority from Korean Patent Application No. 10-2020-0017146, filed on Feb. 12, 2020 in the Korean Intellectual Property Office, the disclosure of which is incorporated herein in its entirety by reference.

BACKGROUND

1. Field

Embodiments of the present disclosure relate to a semiconductor light-emitting device and a method of manufacturing the semiconductor light-emitting device, and more particularly, to a semiconductor light-emitting device having excellent light-emitting properties and a method of manufacturing the semiconductor light-emitting device.

2. Description of Related Art

Recently, attempts to apply semiconductor light-emitting devices to display devices have been made. Although display devices according to the related art have mainly included display panels and backlights, display devices using a semiconductor light-emitting device itself as one pixel have been recently proposed. Accordingly, it is required for a semiconductor light-emitting device to have a simple structure allowing low product faults while having better light-emitting properties.

SUMMARY

One or more example embodiments provide a semiconductor light-emitting device, which has excellent light-emitting properties due to no light leakage and has a simple structure allowing low product faults due to no need for a separate partition wall structure for an arrangement of an optical layer, and a method of manufacturing the semiconductor light-emitting device.

Embodiments are not limited to the aspects and advantages set forth above, and other aspects and advantages of the embodiments will be apparent to those of ordinary skill in the art from the following descriptions.

According to an aspect of an example embodiment, there is provided a semiconductor light-emitting device including a substrate having an upper surface and a lower surface, a first insulating layer disposed on the upper surface of the substrate, a plurality of light-emitting structures disposed on the first insulating layer and spaced apart from each other, each of the plurality of light-emitting structures including a first semiconductor layer, an active layer, and a second semiconductor layer, a plurality of optical layers each filling a groove that is formed at a certain depth in the second semiconductor layer of each of the plurality of light-emitting structures, a plurality of first electrodes penetrating the substrate and electrically connected to the first semiconductor layer of each of the plurality of light-emitting structures, respectively, a plurality of second insulating layers disposed on side surfaces of each of the plurality of light-emitting structures, respectively, and a second electrode connected to the plurality of light-emitting structures, the second electrode being disposed on an uppermost surface of the second semiconductor layer of each of the plurality of light-emitting structures and each of the plurality of second insulating layers.

According to another aspect of an example embodiment, there is provided a semiconductor light-emitting device including a substrate having an upper surface and a lower surface, a first insulating layer disposed on the upper surface of the substrate, 3N light-emitting structures disposed on the first insulating layer and spaced apart from each other, where N is an integer of 2 or more, each of the 3N light-emitting structures including a first semiconductor layer, an active layer, and a second semiconductor layer, 3N optical layers each filling a groove that is formed at a certain depth in the second semiconductor layer of each of the 3N light-emitting structure, 3N first electrodes penetrating the substrate and electrically connected to the first semiconductor layer of each of the 3N light-emitting structures, respectively, a plurality of second insulating layers disposed on side surfaces of each of the 3N light-emitting structures, respectively, and a second electrode connected to the 3N light-emitting structures, the second electrode being disposed on an uppermost surface of the second semiconductor layer of each of the 3N light-emitting structures and each of the plurality of second insulating layers, wherein every three light-emitting structures of the 3N light-emitting structures is included in one pixel such that the 3N light-emitting structures form an array of N pixels.

According to another aspect of an example embodiment, there is provided a semiconductor light-emitting device including a substrate having an upper surface and a lower surface, a first insulating layer disposed on the upper surface of the substrate, a first light-emitting structure, a second light-emitting structure, and a third light-emitting structure disposed on the first insulating layer and spaced from each other, each of the first light-emitting structure, the second light-emitting structure, and the third light-emitting structure including a first semiconductor layer, an active layer, and a second semiconductor layer, a first optical layer, which fills a groove having a certain depth and includes a wavelength conversion material configured to convert light into red light, the groove being formed by a protrusion structure of the second semiconductor layer of the first light-emitting structure, a second optical layer, which fills a groove having a certain depth and includes a wavelength conversion material configured to convert light into green light, the groove being formed by the protrusion structure of the second semiconductor layer of the second light-emitting structure, a third optical layer, which fills a groove having a certain depth and includes a wavelength conversion material configured to convert light into blue light or includes a transparent material, the groove being formed by the protrusion structure of the second semiconductor layer of the third light-emitting structure, a plurality of first electrodes penetrating the substrate and electrically connected to the first semiconductor layer of each of the first light-emitting structure, the second light-emitting structure, and the third light-emitting structure, a plurality of second insulating layers disposed on side surfaces of each of the first light-emitting structure, the second light emitting structure, and the third light-emitting structure, respectively, and a second electrode penetrating the substrate and connected to the first light-emitting structure, the second light emitting structure, and the third light-emitting structure, the second electrode disposed on an uppermost surface of the second semiconductor layer of each of the first light-emitting structure, the second light emitting structure, and the third light-emitting structure and each of the plurality of second insulating layers.

BRIEF DESCRIPTION OF THE DRAWINGS

The above and/or other aspects, features, and advantages of the embodiments will be more clearly understood from the following detailed description, taken in conjunction with the accompanying drawings, in which:

FIGS. 3A, 3B, and 3C are diagrams illustrating a semiconductor light-emitting device according to an example embodiment;

FIGS. 9A, 9B, and 9C are diagrams illustrating a semiconductor light-emitting device according to an example embodiment;

FIG. 11 is a flowchart illustrating sequential processes of a method of manufacturing a semiconductor light-emitting device according to an example embodiment.

DETAILED DESCRIPTION OF THE EMBODIMENTS

Hereinafter, example embodiments will be described in detail with reference to the accompanying drawings.

Figure 1:
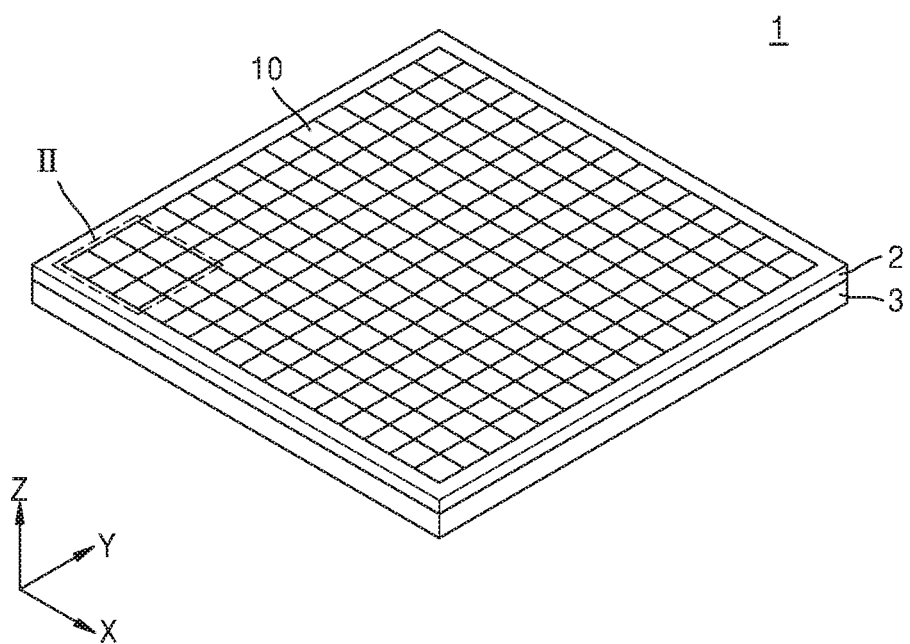
FIG. 1 is a schematic perspective view of a display device including a semiconductor light-emitting device according to an example embodiment.

FIG. 1 is a schematic perspective view of a display device including a semiconductor light-emitting device according to an example embodiment.

Referring to FIG. 1, a display device 1 including a plurality of semiconductor light-emitting devices 10 according to the example embodiment is illustrated, and the display device 1 may include a circuit substrate 3 and a display panel 2 on the circuit substrate 3.

The display panel 2 may include the plurality of semiconductor light-emitting devices 10 configured to emit light in which red (R) light, green (G) light, and blue (B) light are mixed. Each semiconductor light-emitting device 10 may include one pixel in the display panel 2, and the plurality of semiconductor light-emitting devices 10 may be arranged in rows and columns on the circuit substrate 3. Although FIG. 1 illustrates that the semiconductor light-emitting devices 10 are arranged in 15 rows and 15 columns, this is merely an example and for convenience of descriptions, and a higher number of semiconductor light-emitting devices 10 may be actually arranged according to a required resolution.

Figure 3A:
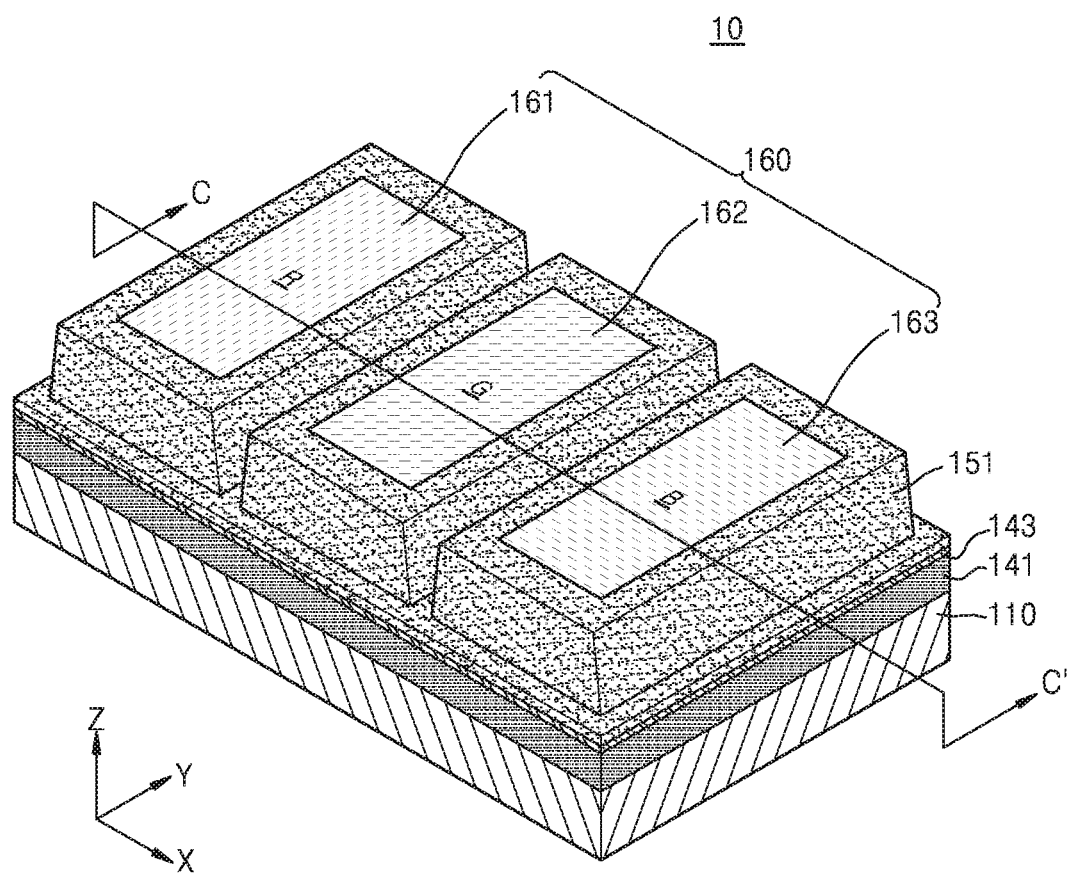
Figure 3C:
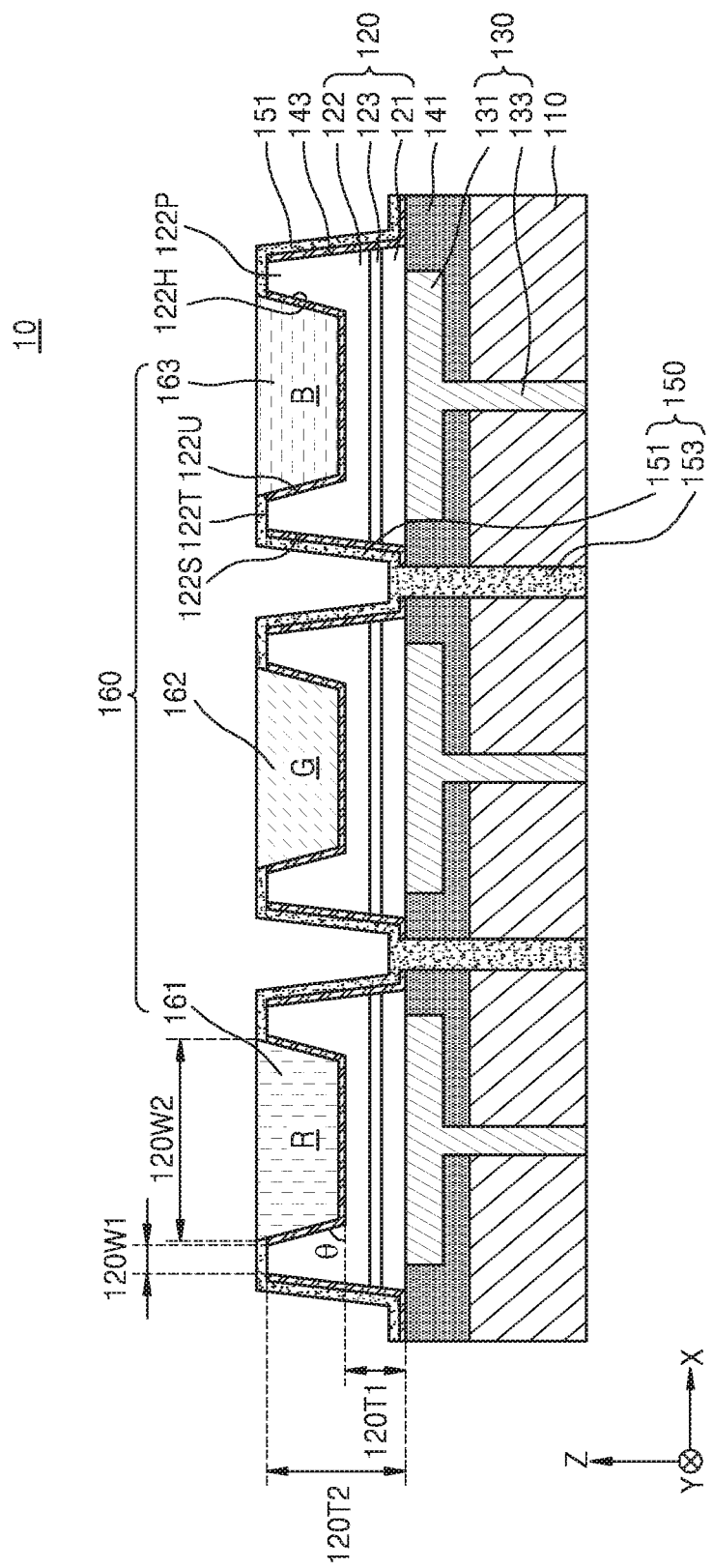

Each semiconductor light-emitting device 10 may include a plurality of sub-pixels corresponding to RGB light sources, and the plurality of sub-pixels in one semiconductor light-emitting device 10 may be arranged adjacent to each other. This will be describe in more detail with reference to FIGS. 3A to 3C. Although FIGS. 3A to 3C illustrate that one pixel includes three sub-pixels corresponding to RGB light sources, the example embodiment is not limited thereto, and one pixel may include four or more sub-pixels. For example, various colors such as cyan (C), yellow (Y), magenta (M), and black (B) may be used for the sub-pixels.

In the circuit substrate 3, a drive unit configured to supply power to the semiconductor light-emitting devices 10 of the display panel 2 and a control circuit configured to control the drive unit may be arranged. The circuit substrate 3 may include a circuit configured to independently drive each pixel and sub-pixels thereof. For example, the circuit substrate 3 may include a thin film transistor (TFT).

Figure 2:
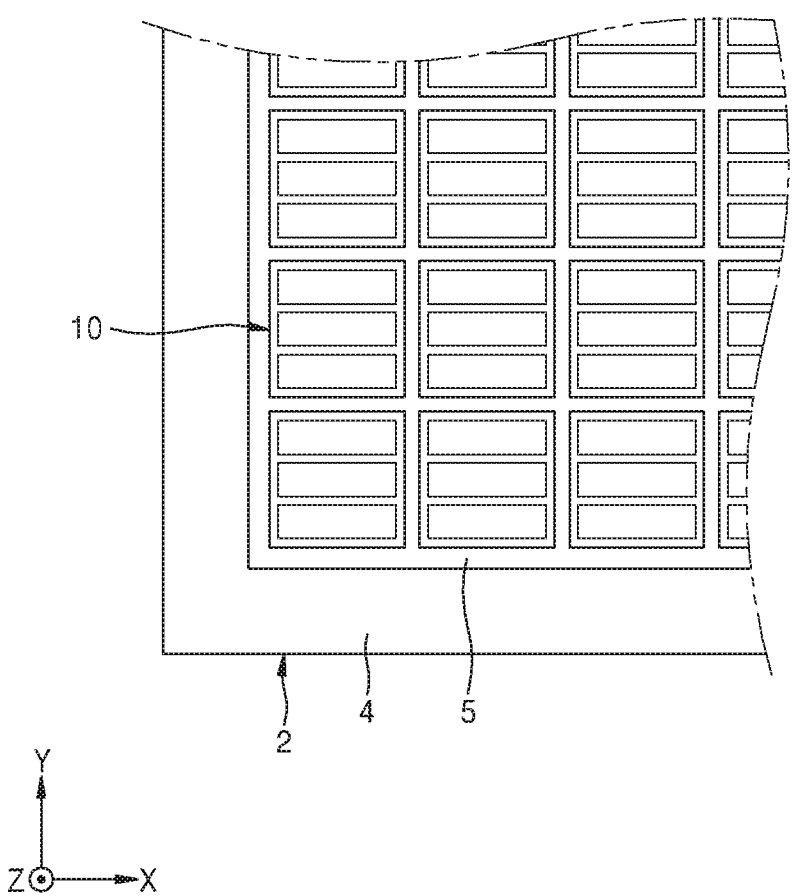
FIG. 2 is an expanded plan view illustrating a region II of FIG. 1.

FIG. 2 is an expanded plan view illustrating a region II of FIG. 1.

Referring to FIG. 2, the display panel 2 may include a first structure 4 defining a region in which the plurality of semiconductor light-emitting devices 10 are arranged, and each of the plurality of semiconductor light-emitting devices 10 may be arranged to be surrounded by a second structure 5.

The second structure 5 may electrically separate the semiconductor light-emitting devices 10 from each other, and thus may allow each semiconductor light-emitting device 10 to be independently driven as one pixel. In addition, the second structure 5 may firmly secure the plurality of semiconductor light-emitting devices 10 onto the display panel 2. However, embodiments are not limited thereto. For example, in a semi-conductor light emitting device according to an example embodiment, the first structure 4 and the second structure 5 may be omitted.

The first structure 4 and the second structure 5 may include a matrix. For example, the matrix may be arranged around the display panel 2, and thus may serve as a guideline defining a mounting region of the plurality of semiconductor light-emitting devices 10. The matrix is not limited to black matrix and may use another color such as white or green according to a purpose of a product, a use-place of a product, and the like. The matrix including a transparent material may be used, as needed.

The matrix may include at least one of a polymer including a resin, ceramic, a semiconductor, and a metal. When the matrix is white, the matrix may further include a reflective material or a scattering material.

FIGS. 3A to 3C are diagrams illustrating a semiconductor light-emitting device, according to an example embodiment.

Specifically, FIG. 3 illustrates a perspective view of the semiconductor light-emitting device 10, FIG. 3B illustrates a plan view of the semiconductor light-emitting device 10, and FIG. 3C illustrates a cross-sectional view of the semiconductor light-emitting device 10, taken along a line C-C' of FIG. 3A.

Referring to FIGS. 3A to 3C, the semiconductor light-emitting device 10 is illustrated, the semiconductor light-emitting device 10 including a substrate 110, a plurality of light-emitting structures 120, a plurality of first electrodes 130, first insulating layer 141 and second insulating layer 143, a second electrode 150, and a plurality of optical layers 160.

The substrate 110 may include an insulating substrate, a conductive substrate, or a semiconductor substrate. For example, a material included in the substrate 110 may include, but is not limited to, sapphire ($Al_2O_3$), gallium nitride (GaN), silicon (Si), germanium (Ge), gallium arsenide (GaAs), zinc oxide (ZnO), silicon germanium (SiGe), silicon carbide (SiC), gallium oxide ($Ga_2O_3$), lithium gallium oxide (LiGaO$_2$), lithium aluminum oxide (LiAlO$_2$), magnesium aluminum oxide (MgAl$_2$O$_4$), or the like.

The substrate 110 may be arranged to face the plurality of light-emitting structures 120 and may support the plurality of light-emitting structures 120. The substrate 110 may receive heat generated from the plurality of light-emitting structures 120 via a base layer and may discharge the heat out of the semiconductor light-emitting device 10. In some example embodiments, the substrate 110 may have light transmitting properties. In this case, the substrate 110 may include a light transmitting material or include a material that may have light transmitting properties when the material is formed to a certain thickness or less.

Each of the plurality of light-emitting structures 120 may include a first semiconductor layer 121, an active layer 123, and a second semiconductor layer 122, and the plurality of light-emitting structures 120 may be separated and spaced apart from each other. The plurality of light-emitting structures 120 may be included in one pixel, and each of the plurality of light-emitting structures 120 may be operated as a sub-pixel. Although FIGS. 3A to 3C illustrate that one semiconductor light-emitting device 10 includes three sub-pixels corresponding to three light-emitting structures, embodiments are not limited thereto. For example, one semiconductor light-emitting device 10 may include more than three sub-pixels.

The first semiconductor layer 121 may include a nitride semiconductor layer satisfying p-type In$_x$Al$_y$Ga$_{1-x-y}$N (where 0≤x<1, 0≤y<1, and 0≤x+y<1), and magnesium (Mg) may be used as a p-type impurity. In some example embodiments, the first semiconductor layer 121 may have a single-layer structure. In other example embodiments, the first semiconductor layer 121 may have a multilayer structure including multiple layers that respectively have different compositions. For example, the first semiconductor layer 121 may include an electron blocking layer, a low-concentration p-type GaN layer, and a high-concentration p-type GaN layer. An energy band gap ($E_g$) of the electron blocking layer may decrease with an increasing distance from the active layer 123. For example, aluminum (Al) among materials included in the electron blocking layer may decrease as a distance from the active layer 123 increases.

The active layer 123 may have a multi-quantum well (MQW) structure in which a quantum well layer and a quantum barrier layer are alternately stacked. For example, the quantum well layer and the quantum barrier layer may include In$_x$Al$_y$Ga$_{1-x-y}$N layers (where 0≤x≤1, 0≤y≤1, and 0≤x+y≤1) having different compositions, respectively. In some example embodiments, the quantum well layer may include an In$_x$Ga$_{1-x}$N layer (where 0<x≤1), and the quantum barrier layer may include a GaN layer or an AlGaN layer. However, embodiments are not limited thereto. For example, the active layer 123 is not limited to the MQW structure and may have a single quantum well (SQW) structure.

The second semiconductor layer 122 may include a nitride semiconductor layer satisfying n-type In$_x$Al$_y$Ga$_{1-x-y}$N (where 0≤x<1, 0≤y<1, and 0≤x+y<1), and silicon (Si) may be used as an n-type impurity. For example, the second semiconductor layer 122 may include an n-type GaN layer. In some example embodiments, the second semiconductor layer 122 may include a contact layer and a current diffusion layer. The current diffusion layer may have a structure in which a plurality of In$_x$Al$_y$Ga$_{(1-x-y)}$N layers (where 0≤x, y≤1, and 0≤x+y≤1) having different compositions or different amounts of impurities are repeatedly stacked.

A groove 122H having a certain depth is formed in the second semiconductor layer 122, and a protrusion structure 122P surrounding the groove 122H is integrated with the groove 122H. The protrusion structure 122P may have a trapezoidal cross-sectional shape having an increasing width towards the substrate 110. In addition, an inner side surface 122U of the protrusion structure 122P may be inclined at an angle 0° that is about 90° or less with respect to an upper surface of the substrate 110.

In a cross-sectional view, the second semiconductor layer 122 may have a U-shaped structure, and an upper surface of the second semiconductor layer 122 may have an uneven structure. Because the groove 122H is formed to a certain depth, a first height 120T1 from a lowermost surface of the first semiconductor layer 121 to a bottom surface of the groove 122H may range from about 0.5 μm to about 9 μm, and a second height 120T2 from the lowermost surface of the first semiconductor layer 121 to an uppermost surface 122T of the second semiconductor layer 122 may be about 10 μm or less. Here, the second height 120T2 may be greater than the first height 120T1.

A first electrode 130 may be arranged under the first semiconductor layer 121. The first electrode 130 may be electrically connected to a lower surface of the first semiconductor layer 121. In some example embodiments, the first electrode 130 may directly contact the lower surface of the first semiconductor layer 121. The first electrode 130 may include, for example, a metal such as silver (Ag), aluminum (Al), nickel (Ni), chromium (Cr), copper (Cu), aurum (Au), palladium (Pd), platinum (Pt), tin (Sn), tungsten (W), rhodium (Rh), iridium (Ir), ruthenium (Ru), magnesium (Mg), or zinc (Zn). However, embodiments are not limited thereto. For example, the first electrode 130 may include, for example, a transparent electrode such as indium tin oxide (ITO). In some example embodiments, the first electrode 130 may include a metal material having high reflectivity, and thus function as a reflective electrode. According to an example embodiment, an ohmic electrode may be arranged between the first electrode 130 and the first semiconductor layer 121.

The first electrode 130 may include a first upper portion 131 and a first lower portion 133. In some example embodiments, the first upper portion 131 may directly contact the first lower portion 133. The first lower portion 133 may penetrate the substrate 110, one end of the first lower portion 133 may be connected to the first upper portion 131, and the other end of the first lower portion 133 may be exposed at a lower surface of the substrate 110. That is, the first lower portion 133 may extend in a direction (Z direction) perpendicular to the upper surface of the substrate 110.

The first insulating layer 141 may be arranged on the upper surface of the substrate 110, a side surface of the first electrode 130, and the lower surface of the first semiconductor layer 121. The first insulating layer 141 may cover a portion of the lower surface of the first semiconductor layer 121 that is not contacting the first electrode 130. The first insulating layer 141 may separate each light-emitting structure 120 from the substrate 110.

The first insulating layer 141 may include, for example, silicon oxide, silicon nitride, silicon oxynitride, or a combination thereof. Although FIGS. 3A to 3C illustrate that the first insulating layer 141 includes a single layer, embodiments are not limited thereto. For example, the first insulating layer 141 may have a multilayer structure in which a plurality of insulating layers are stacked. For example, such a multilayer structure may be a distributed Bragg reflector in which an insulating layer having a first refractive index and an insulating layer having a second refractive index different from the first refractive index are alternately stacked.

The second insulating layer 143 may be arranged on an upper surface of each light-emitting structure 120. The second insulating layer 143 may expose the uppermost surface 122T of the second semiconductor layer 122. The second semiconductor layer 122 may be electrically connected to the second electrode 150 via the uppermost surface 122T of the second semiconductor layer 122, the uppermost surface 122T being exposed by the second insulating layer 143. The second insulating layer 143 may conformally cover a side surface of the first semiconductor layer 121, a side surface of the active layer 123, an outer side surface 122S and the inner side surface 122U of the second semiconductor layer 122, and the bottom surface of the groove 122H. The second insulating layer 143 may cover the surfaces of each light-emitting structure 120 except for the uppermost surface 122T of the second semiconductor layer 122.

The second insulating layer 143 may include, for example, silicon oxide, silicon nitride, silicon oxynitride, or a combination thereof. Although FIGS. 3A to 3C illustrate that the second insulating layer 143 includes a single layer, the second insulating layer 143 may have a multilayer structure in which a plurality of insulating layers are stacked.

The first insulating layer 141 and the second insulating layer 143 may cover a portion of each light-emitting structure 120 except for portions of each light-emitting structure 120, which contact the first electrode 130 and the second electrode 150 to protect each light-emitting structure 120. In addition, the first insulating layer 141 and the second insulating layer 143 may prevent the first semiconductor layer 121 from contacting the second electrode 150 or prevent the second semiconductor layer 122 from contacting the first electrode 130.

The second electrode 150 may be arranged to on outer side surfaces and upper surfaces of the plurality of light-emitting structures 120. The second electrode 150 may be electrically connected to the second semiconductor layer 122. In some example embodiments, the second electrode 150 may directly contact the uppermost surface 122T of the second semiconductor layer 122. The second electrode 150 may include, for example, a metal such as Ag, Al, Ni, Cr, Cu, Au, Pd, Pt, Sn, W, Rh, Ir, Ru, Mg, or Zn. However, embodiments are not limited thereto. For example, the second electrode 150 may include, for example, a transparent electrode such as ITO. In some example embodiments, the second electrode 150 may include a metal material having high reflectivity, and thus function as a reflective electrode.

The second electrode 150 may include a second upper portion 151 and a second lower portion 153. In some example embodiments, the second upper portion 151 may directly contact the second lower portion 153. The second lower portion 153 may penetrate the substrate 110, one end of the second lower portion 153 may be connected to the second upper portion 151, and the other end of the second lower portion 153 may be exposed at the lower surface of the substrate 110. That is, the second lower portion 153 may extend in the direction (Z direction) perpendicular to the upper surface of the substrate 110. In other example embodiments, the second lower portion 153 may not penetrate the substrate 110.

The second upper portion 151 of the second electrode 150 may be arranged to be connected to the plurality of light-emitting structures 120 while covering and contacting the uppermost surface 122T of the second semiconductor layer 122 and the second insulating layer 143. Accordingly, because most of light generated from the plurality of light-emitting structures 120 is reflected by the second electrode 150, light leakage may be significantly reduced. In addition, because the second upper portion 151 is connected to the second semiconductor layers 122 of the plurality of light-emitting structures 120 separated from each other, the plurality of light-emitting structures 120 may be supplied with an operation voltage from one second electrode 150.

Each of the plurality of optical layers 160 may include a resin including a wavelength conversion material. For example, the wavelength conversion material may include a fluorescent material, and the resin may include a silicone resin, an epoxy resin, or a combination thereof. In addition, the wavelength conversion material included in each of the plurality of optical layers 160 may include an organic material such as a resin or may include an inorganic material such as $In_xAl_yGa_{1-x-y}N$. In some example embodiments, each of the plurality of optical layers 160 may have electrical insulating properties.

The plurality of optical layers 160 may include a first optical layer 161, a second optical layer 162, and a third optical layer 163, which include materials providing light having different wavelengths, respectively. In some example embodiments, the first optical layer 161 may include a red fluorescent material (R), the second optical layer 162 may include a green fluorescent material (G), and the third optical layer 163 may include a blue fluorescent material (B). However, embodiments are not limited thereto. For example, the third optical layer 163 may include a transparent material including no wavelength conversion material.

Here, when converting a wavelength of at least a portion of light emitted from each of the plurality of light-emitting structures 120, each of the plurality of optical layers 160 may be referred to as a wavelength conversion layer. According to example embodiments an optical layer may include a wavelength conversion material, or not include a wavelength conversion material.

In some example embodiments, quantum dots may be used as the wavelength conversion material included in each of the plurality of optical layers 160. The quantum dots may have a core-shell structure by using a Group III-V or Group II-VI compound semiconductor. For example, the quantum dots may each have a core such as cadmium selenide (CdSe) or indium phosphide (InP) and a shell such as zinc sulfide (ZnS) or zin selenide (ZnSe). In addition, the quantum dots may include a ligand for stabilization of the core and the shell. Here, the core may have a diameter of about 1 nm to about 30 nm, specifically about 3 nm to about 10 nm. The shell may have a thickness of about 0.1 nm to about 20 nm, specifically about 0.5 nm to about 2 nm.

The quantum dots may implement various colors according to the sizes of the quantum dots, and in particular, when the quantum dots are used as a material substituting for an optical layer 160, the quantum dots may be used as a wavelength conversion material. When the quantum dots are used, a small full-width at half-maximum, for example, about 35 nm, may be implemented.

In other example embodiments, each of the plurality of optical layers 160 may include an optical layer in which a wavelength conversion material is dispersed in a resin, an optical layer including a ceramic fluorescent material sintered by agglomeration of particles of a wavelength conversion material, an optical layer in which a layer providing a wavelength conversion function is included in a single crystal, and the like.

Each of the first optical layer 161, the second optical layer 162, and the third optical layer 163 may fill the groove 122H of the second semiconductor layer 122. For example, each of the first optical layer 161, the second optical layer 162, and the third optical layer 163 may be confined within a light-emitting structure 120 by the protrusion structure 122P of the second semiconductor layer 122. The second insulating layer 143 may be arranged between each of the first optical layer 161, the second optical layer 162, and the third optical layer 163 and the second semiconductor layer 122. A level of an uppermost surface of each of the first optical layer 161, the second optical layer 162, and the third optical layer 163 may be substantially the same as a level of an uppermost surface of the second electrode 150. Each of the first optical layer 161, the second optical layer 162, and the third optical layer 163 may directly contact the second electrode 150 and the second insulating layer 143.

In a cross-sectional view, each of the first optical layer 161, the second optical layer 162, and the third optical layer 163 may have a reversed trapezoidal shape. Accordingly, a first width 120W1 of the uppermost surface 122T of the protrusion structure 122P may be less than a second width 120W2 of the uppermost surface of each of the first optical layer 161, the second optical layer 162, and the third optical layer 163. In addition, in a plan view, the planar area occupied by each of the first optical layer 161, the second optical layer 162, and the third optical layer 163 may be less than the planar area occupied by the first electrode 130 corresponding thereto.

Recently, attempts to apply semiconductor light-emitting devices to display devices have been made. Although display devices according to the related art have mainly included display panels and backlights, display devices using a semiconductor light-emitting device itself as one pixel have been recently proposed. Accordingly, it is required for a semiconductor light-emitting device to have a simple structure allowing low product faults while having better light-emitting properties.

According to the example embodiment, because the optical layer 160 may be arranged in the groove 122H of the second semiconductor layer 122 without a need for a separate partition wall structure for an arrangement of the optical layer 160, the semiconductor light-emitting device 10 may have a simpler structure that allows lower product faults.

In addition, according to the example embodiment, because most of light generated from the plurality of light-emitting structures 120 is reflected by the first electrode 130 and the second electrode 150, the semiconductor light-emitting device 10 may exhibit significantly reduced light leakage.

Eventually, according to the example embodiment, the semiconductor light-emitting device 10 may have a higher productivity due to lower product faults and may have improved light-emitting properties due to no light leakage.

FIGS. 4 to 7 are cross-sectional views each illustrating a semiconductor light-emitting device according to an example embodiments.

Most components included in semiconductor light-emitting devices 20, 30, 40, and 50 described below and descriptions thereof are substantially identical or similar to the components and descriptions given with reference to FIGS. 3A to 3C. Thus, differences from the semiconductor light-emitting device 10 described above will be mainly described.

Figure 4:
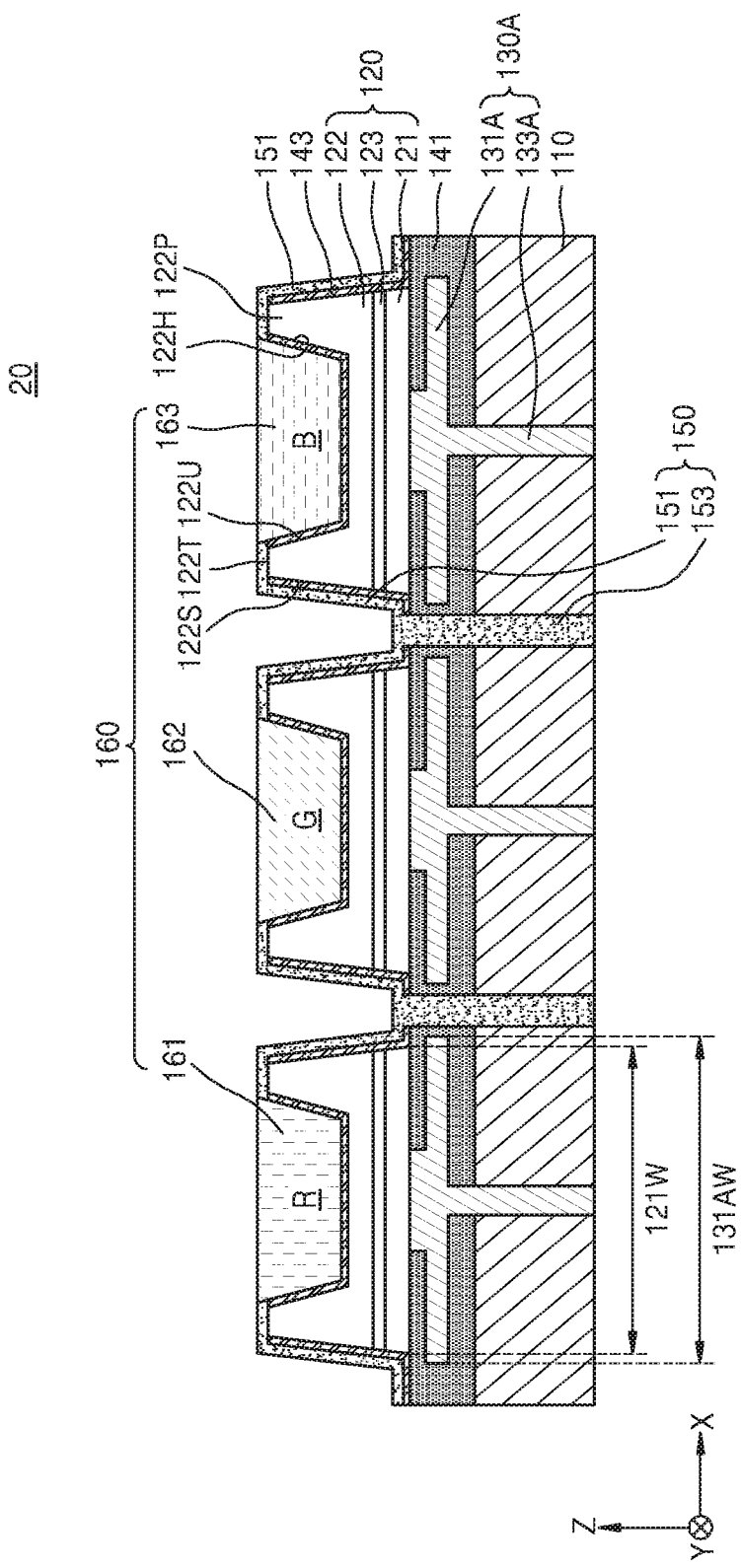
FIGS. 4, 5, 6, and 7 are cross-sectional views each illustrating a semiconductor light-emitting device according to example embodiments.

FIG. 4 illustrates a semiconductor light-emitting device 20 according to an example embodiment. The semiconductor light-emitting device 20 includes the substrate 110, the plurality of light-emitting structures 120, a plurality of first electrodes 130A, the first insulating layer 141 and the second insulating layer 143, the second electrode 150, and the plurality of optical layers 160.

In the semiconductor light-emitting device 20, a first electrode 130A may be arranged under the first semiconductor layer 121. The first electrode 130A may be electrically connected to the lower surface of the first semiconductor layer 121. In some example embodiments, the first electrode 130A may directly contact the lower surface of the first semiconductor layer 121. In some example embodiments, the first electrode 130A may include a metal material having high reflectivity, and thus function as a reflective electrode.

The first electrode 130A may include a first upper portion 131A and a first lower portion 133A. In some example embodiments, the first upper portion 131A may directly contact the first lower portion 133A. A central region of the first upper portion 131A may contact the first semiconductor layer 121 and a peripheral region of the first upper portion 131A may not contact the first semiconductor layer 121. That is, the first upper portion 131A may have a step structure.

In addition, in a cross-sectional view, a maximum width 121W of the first semiconductor layer 121 may be less than a maximum width 131AW of the first upper portion 131A of the first electrode 130 corresponding to the first semiconductor layer 121. As such, due to the first upper portion 131A, because most of light generated from the plurality of light-emitting structures 120 is reflected by the first electrode 130, light leakage may be significantly reduced.

The first lower portion 133A may penetrate the substrate 110, one end of the first lower portion 133A may be connected to the first upper portion 131A, and the other end of the first lower portion 133A may be exposed at the lower surface of the substrate 110. That is, the first lower portion 133A may extend in the direction (Z direction) perpendicular to the upper surface of the substrate 110.

The first insulating layer 141 may be arranged on the upper surface of the substrate 110, a side surface of the first electrode 130A, a portion of an upper surface of the first electrode 130A, and the lower surface of the first semiconductor layer 121. The first insulating layer 141 may cover a portion of the lower surface of the first semiconductor layer 121 that is the portion not contacting the first electrode 130A.

Figure 5:
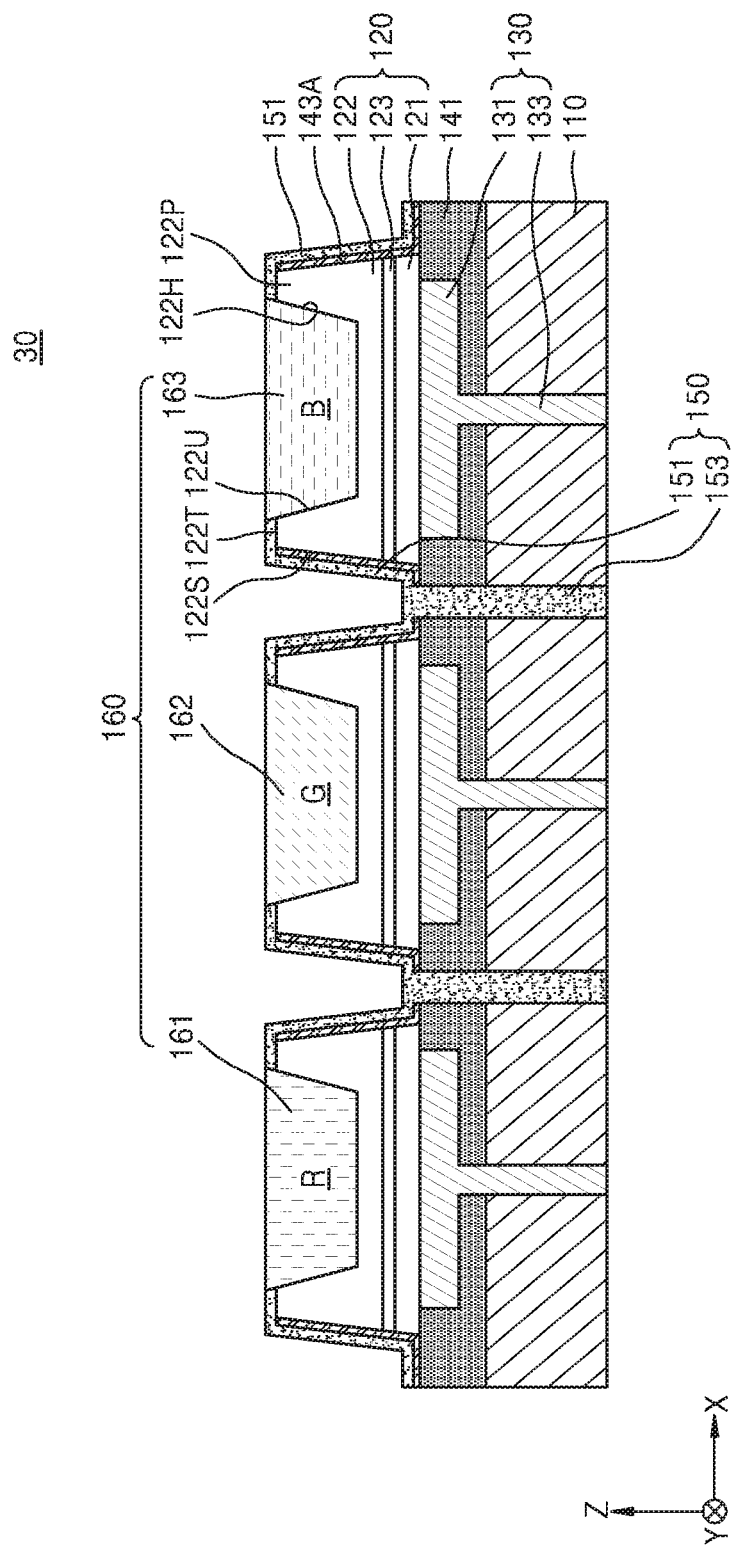

FIG. 5 illustrates a semiconductor light-emitting device 30 according to an example embodiment. The semiconductor light-emitting device 30 includes the substrate 110, the plurality of light-emitting structures 120, the plurality of first electrodes 130, the first insulating layer 141 and the second insulating layer 143A, the second electrode 150, and the plurality of optical layers 160.

In the semiconductor light-emitting device 30, the second insulating layer 143A may be arranged on an upper surface of the light-emitting structure 120. However, the second insulating layer 143A may expose the uppermost surface 122T of the second semiconductor layer 122, the inner side surface 122U of the second semiconductor layer 122, and the bottom surface of the groove 122H. The second semiconductor layer 122 may be electrically connected to the second electrode 150 via the uppermost surface 122T of the second semiconductor layer 122, the uppermost surface 122T being exposed by the second insulating layer 143A. For example, the second insulating layer 143A may conformally cover the side surface of the first semiconductor layer 121, the side surface of the active layer 123, and the outer side surface 122S of the second semiconductor layer 122. In other words, the second insulating layer 143A may cover the surfaces of the light-emitting structure 120 except for the groove 122H of the second semiconductor layer 122.

The first insulating layer 141 and the second insulating layer 143A may cover a portion of the light-emitting structure 120 except for portions of the light-emitting structure 120, which contact the first electrode 130 and the second electrode 150 and the optical layer 160, thereby protecting the light-emitting structure 120. In addition, the first insulating layer 141 and the second insulating layer 143A may prevent the first semiconductor layer 121 from contacting the second electrode 150 or prevent the second semiconductor layer 122 from contacting the first electrode 130.

Each of the first optical layer 161, the second optical layer 162, and the third optical layer 163 may fill the groove 122H of the second semiconductor layer 122. For example, each of the first optical layer 161, the second optical layer 162, and the third optical layer 163 may be confined within the light-emitting structure 120 by the protrusion structure 122P of the second semiconductor layer 122. Each of the first optical layer 161, the second optical layer 162, and the third optical layer 163 may directly contact the second semiconductor layer 122. Accordingly, each of the first optical layer 161, the second optical layer 162, and the third optical layer 163 may directly contact the second electrode 150 and the second semiconductor layer 122.

Figure 6:
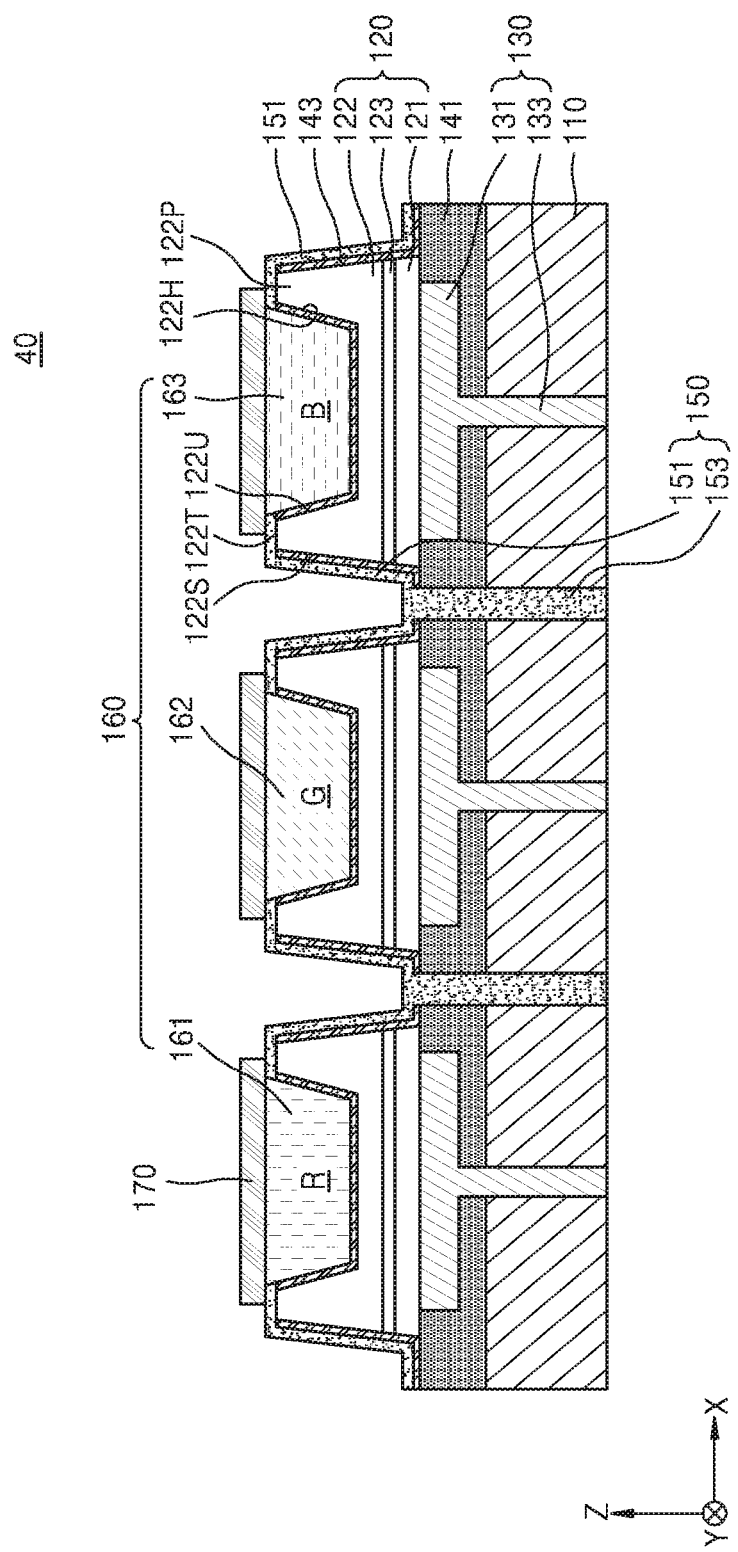

FIG. 6 illustrates a semiconductor light-emitting device 40 according to an example embodiment. The semiconductor light-emitting device 40 includes the substrate 110, the plurality of light-emitting structures 120, the plurality of first electrodes 130, the first insulating layer 141 and the second insulating layer 143, the second electrode 150, the plurality of optical layers 160, and a transparent protective layer 170.

In the semiconductor light-emitting device 40, the transparent protective layer 170 may protect the plurality of optical layers 160, and thus structurally stabilize the semiconductor light-emitting device 40. The transparent protective layer 170 may transmit light. The transparent protective layer 170 may include a transparent material such as a silicon oxide film, a silicon nitride film, a silicon oxynitride film, an elastic resin, an epoxy resin, a polymer, or plastics.

The transparent protective layer 170 may be arranged on the uppermost surface of each of the first optical layer 161, the second optical layer 162, and the third optical layer 163 and a portion of an uppermost surface of the second upper portion 151 of the second electrode 150. In other example embodiments, the transparent protective layer 170 may cover the uppermost surface of each of the first optical layer 161, the second optical layer 162, and the third optical layer 163 and the entire uppermost surface of the second upper portion 151 of the second electrode 150.

Figure 7:
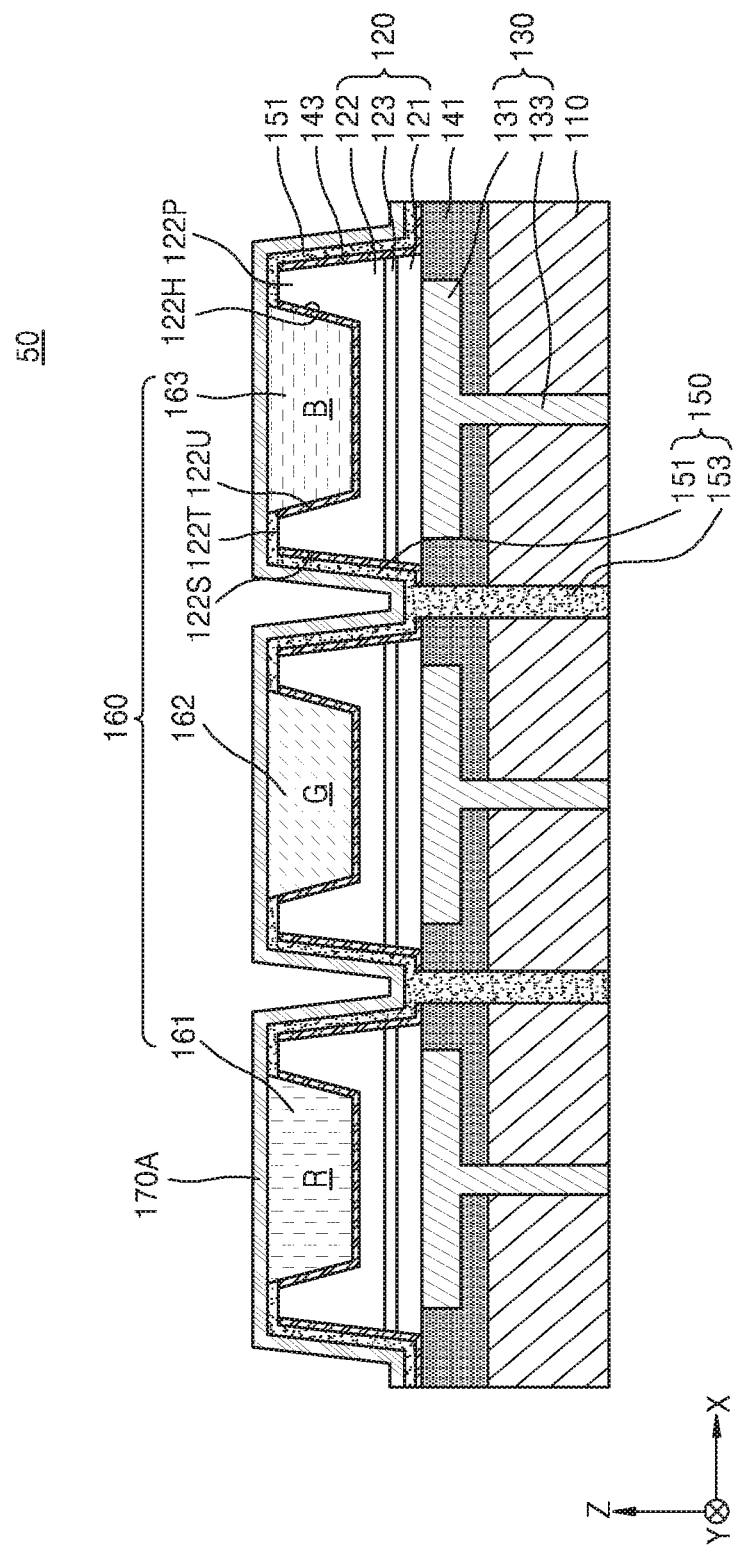

FIG. 7 illustrates a semiconductor light-emitting device 50 according to an example embodiment. The semiconductor light-emitting device 50 includes the substrate 110, the plurality of light-emitting structures 120, the plurality of first electrodes 130, the first insulating layer 141 and the second insulating layer 143, the second electrode 150, the plurality of optical layers 160, and a transparent protective layer 170A.

In the semiconductor light-emitting device 50, the transparent protective layer 170A may protect the plurality of optical layers 160, and thus structurally stabilize the semiconductor light-emitting device 50. The transparent protective layer 170A may transmit light. The transparent protective layer 170A may include a transparent material such as a silicon oxide film, a silicon nitride film, a silicon oxynitride film, an elastic resin, an epoxy resin, a polymer, or plastics.

The transparent protective layer 170A may be arranged on the uppermost surface of each of the first optical layer 161, the second optical layer 162, and the third optical layer 163 and the entire upper surface of the second electrode 150. For example, the transparent protective layer 170A may be arranged to conformally cover an entire upper surface of the semiconductor light-emitting device 50.

Figure 8:
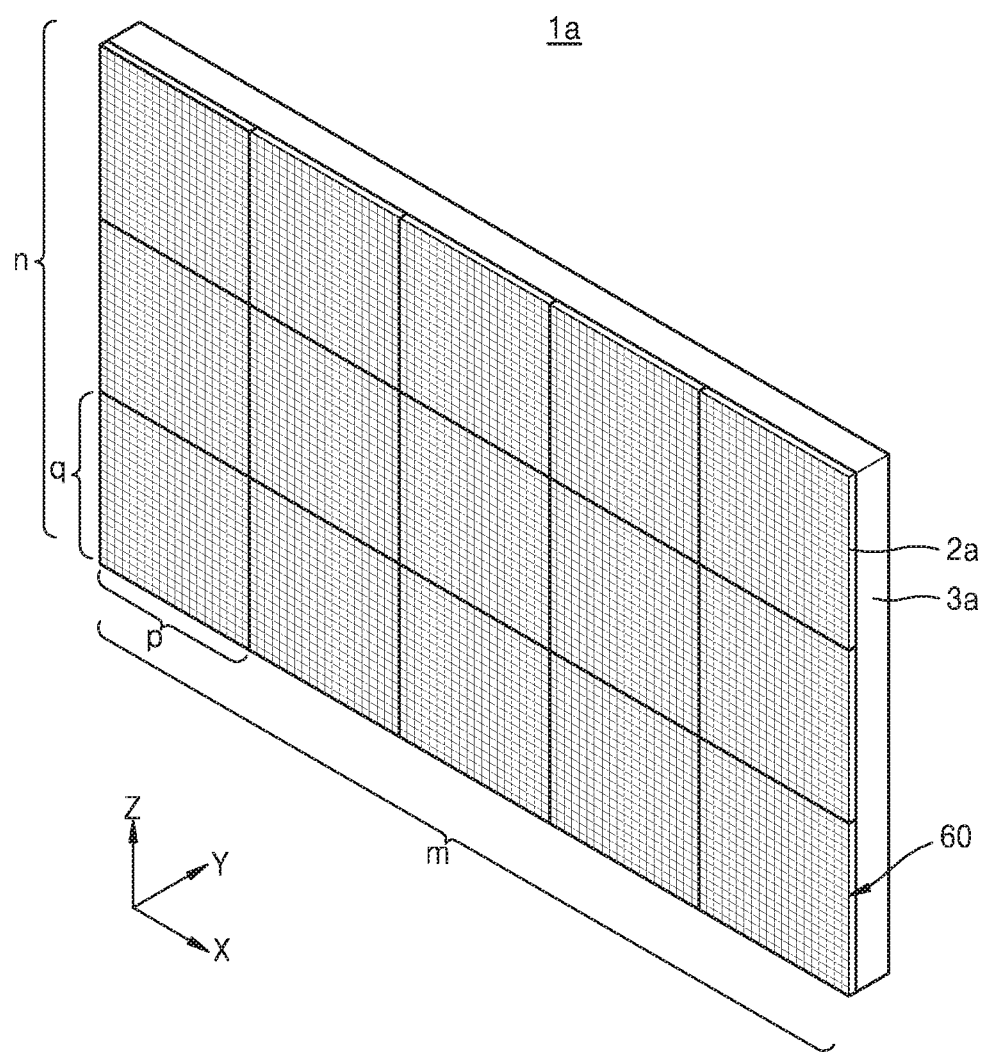
FIG. 8 is a schematic perspective view of a display device including a semiconductor light-emitting device according to an example embodiment.

FIG. 8 is a schematic perspective view of a display device including a semiconductor light-emitting device according to an example embodiment.

FIG. 8 illustrates a display device 1a including a semiconductor light-emitting device 60 according to an example embodiment. The display device 1a may include a circuit substrate 3a and a display panel 2a arranged on the circuit substrate 3a.

The display device 1a may include a plurality of semiconductor light-emitting devices 60. The display device 1a may include m semiconductor light-emitting devices 60 in a first direction (X direction) and include n semiconductor light-emitting devices 60 in a second direction (Y direction) that is perpendicular to the first direction (X direction). Here, each of m and n may be a natural number.

One semiconductor light-emitting device 60 may include multiple pixels including p pixels in the first direction (X direction) and q pixels in the second direction (Y direction). Here, each of p and q may be an integer of 2 or more. In some example embodiments, each of the multiple pixels included in the one semiconductor light-emitting device 60 may include sub-pixels combined in a 3×1, 2×2, or 1×3 matrix form. For example, as illustrated in FIG. 9A, three adjacent sub-pixels 100S may collectively be included in one pixel 100.

Figure 9B:
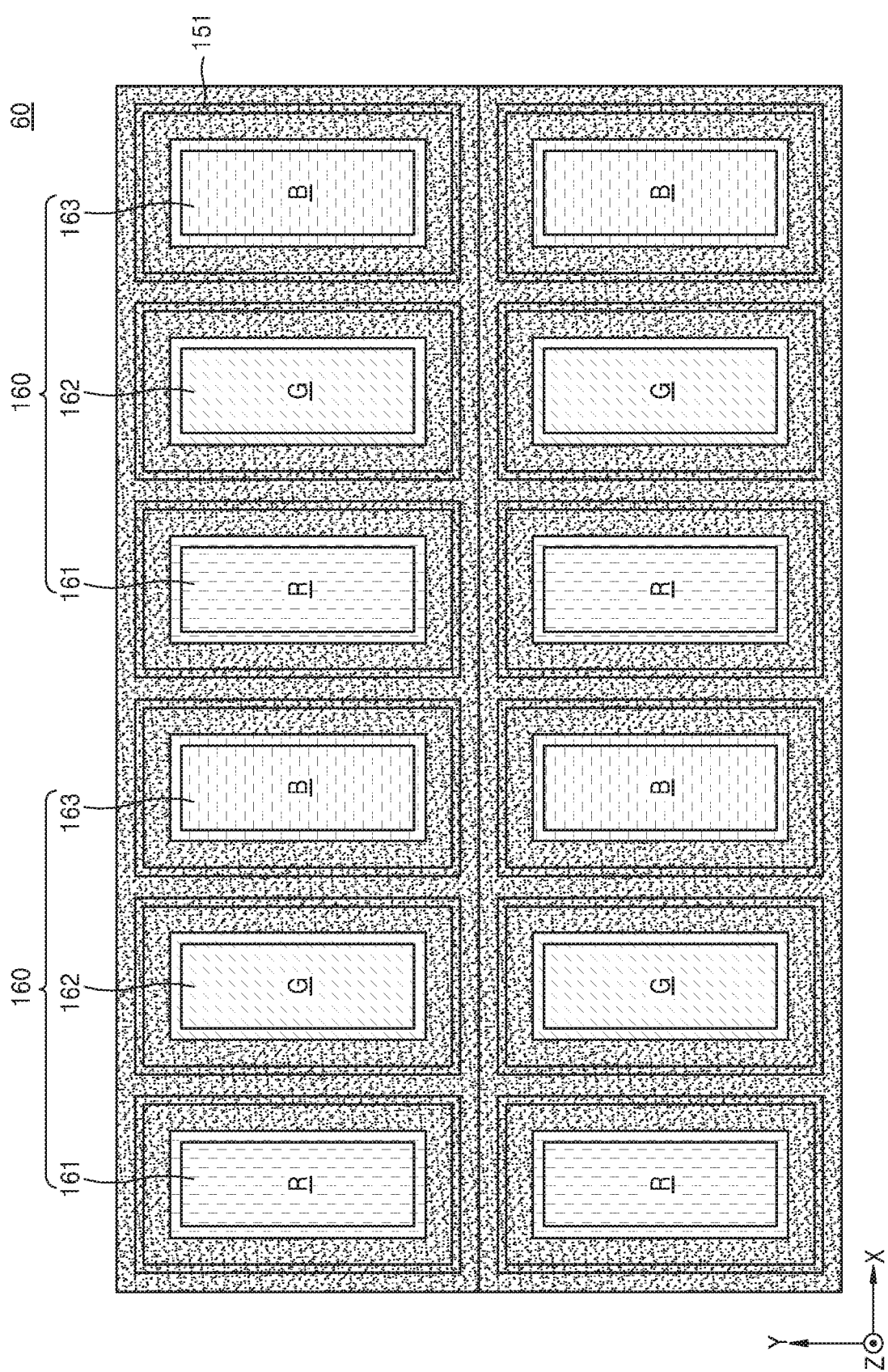
Figure 9C:
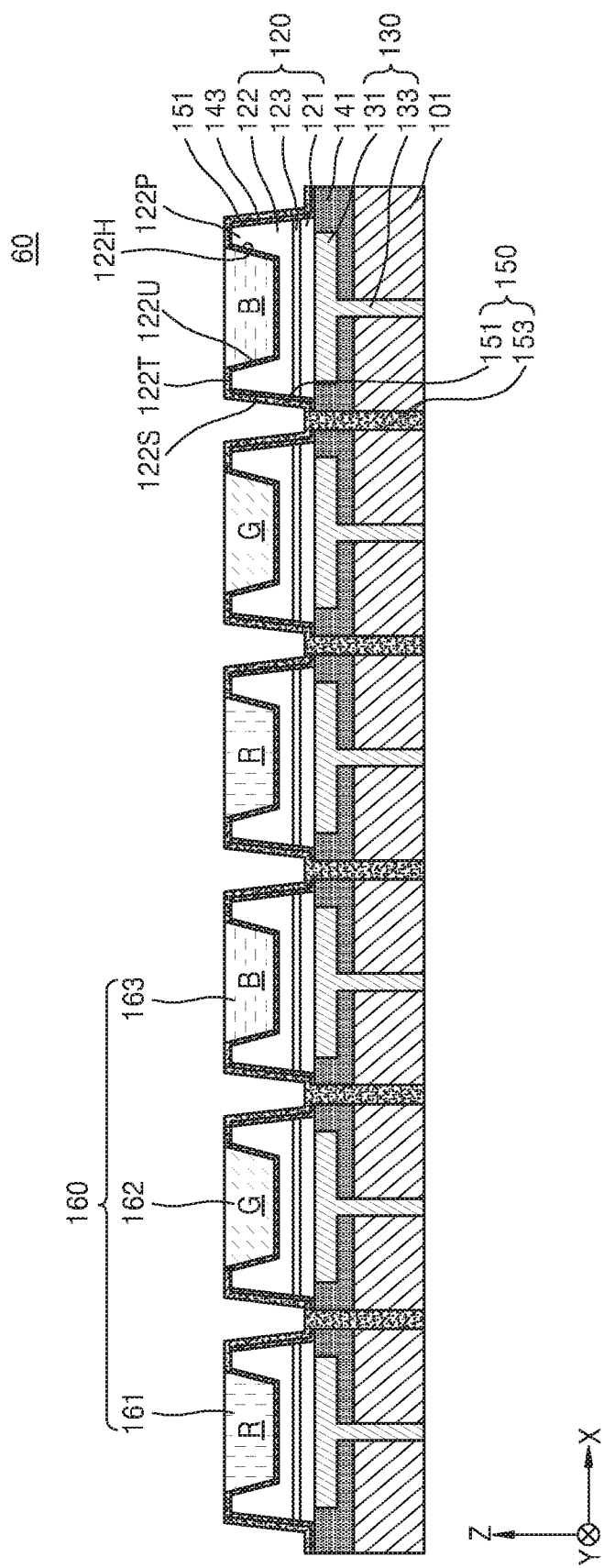

FIGS. 9A to 9C are diagrams illustrating a semiconductor light-emitting device according to an example embodiment of the example embodiment.

Specifically, FIG. 9A illustrates a perspective view of the semiconductor light-emitting device 60, FIG. 9B illustrates a plan view of the semiconductor light-emitting device 60, and FIG. 9C illustrates a cross-sectional view of the semiconductor light-emitting device 60, taken along a line C-C' of FIG. 9A.

Most components included in the semiconductor light-emitting device 60 described below and descriptions thereof are substantially identical or similar to the components and descriptions given with reference to FIGS. 3A to 3C. Thus, differences from the semiconductor light-emitting device 10 described above will be mainly described.

FIGS. 9A to 9C illustrate a semiconductor light-emitting device 60 having multiple pixels 100. The semiconductor light-emitting device 60 includes the substrate 110, the plurality of light-emitting structures 120, the plurality of first electrodes 130, the first insulating layer 141 and the second insulating layer 143, the second electrode 150, and the plurality of optical layers 160.

The semiconductor light-emitting device 60 may include an array in which the multiple pixels 100 including two pixels 100 in the first direction (X direction) and two pixels 100 in the second direction (Y direction) are arranged. FIGS. 9A to 9C illustrate an example of the semiconductor light-emitting device 60 including four pixels 100, which correspond to the case where p=2 and q=2 in the example of FIG. 8. However, the number of pixels 100 included in the semiconductor light-emitting device 60 is not limited thereto.

In some example embodiments, each of the multiple pixels 100 included in the one semiconductor light-emitting device 60 may include the sub-pixels 100S combined in a 3×1 matrix form. Each sub-pixel 100S may include one optical layer 160.

For example, 3N light-emitting structures 120 (where N is an integer of 2 or more) may be included in the semiconductor light-emitting device 60. Three light-emitting structures 120 may be grouped to be included in one pixel 100, whereby the semiconductor light-emitting device 60 may include an array of N pixels.

Each of the first optical layer 161, the second optical layer 162, and the third optical layer 163, which are respectively included in the sub-pixels 100S, may fill the groove 122H of the second semiconductor layer 122. For example, each of the first optical layer 161, the second optical layer 162, and the third optical layer 163, which are respectively included in the sub-pixels 100S, may be confined within the light-emitting structure 120 by the protrusion structure 122P of the second semiconductor layer 122.

The second insulating layer 143 may be arranged between the second semiconductor layer 122 and each of the first optical layer 161, the second optical layer 162, and the third optical layer 163 respectively included in the sub-pixels 100S. The level of the uppermost surface of each of the first optical layer 161, the second optical layer 162, and the third optical layer 163 respectively included in the sub-pixels 100S may be substantially the same as the level of the uppermost surface of the second electrode 150.

Figure 10A:
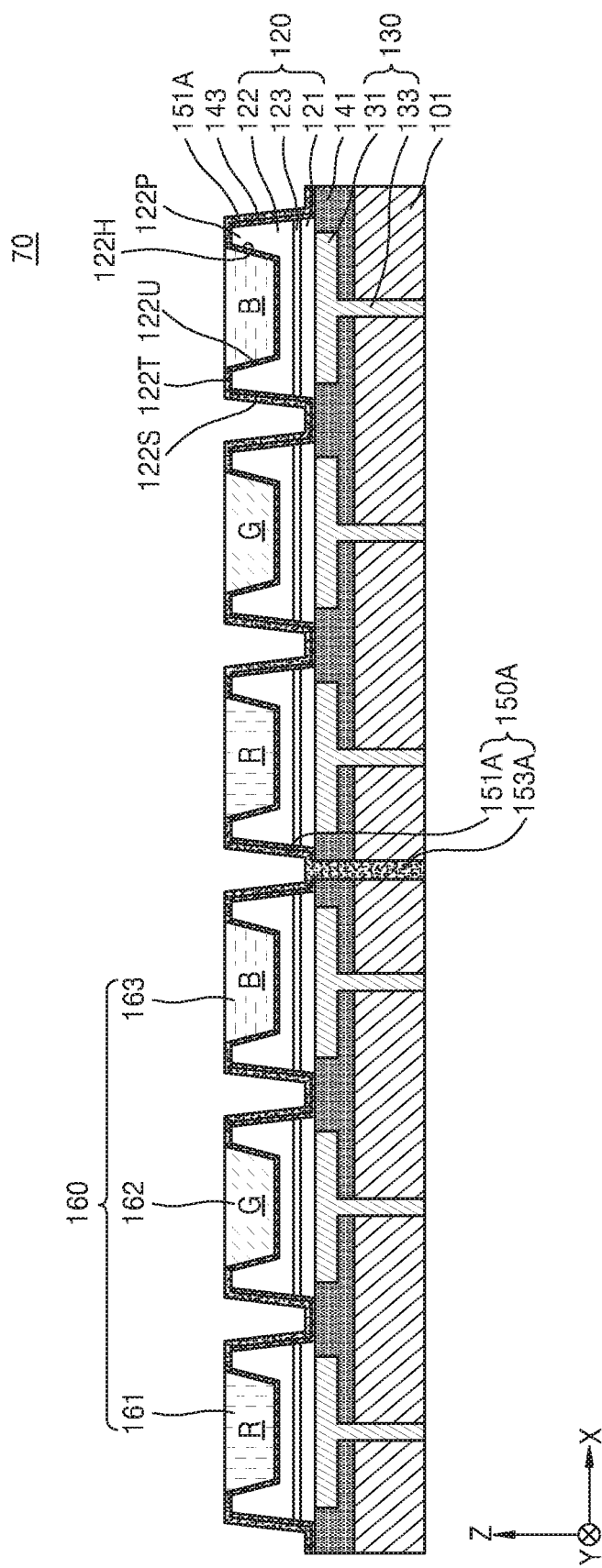
FIGS. 10A and 10B are cross-sectional views each illustrating a semiconductor light-emitting device according to example embodiments.
Figure 10B:
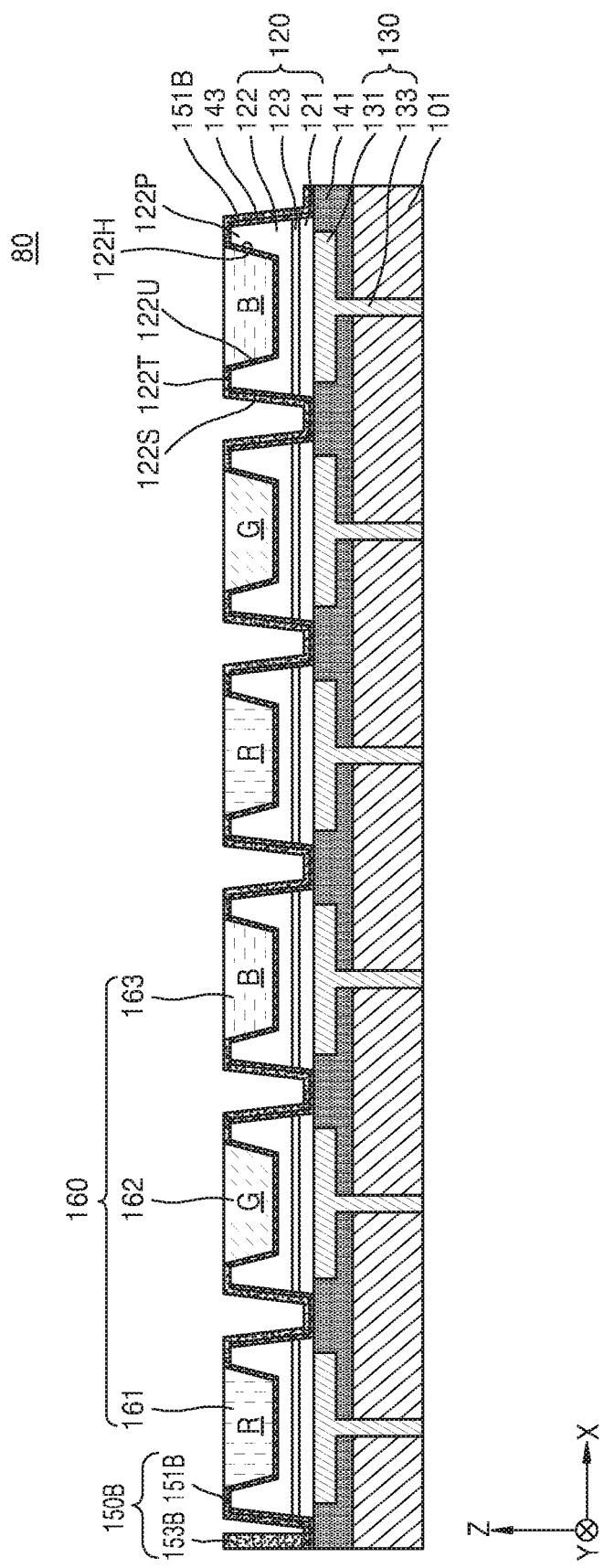

FIGS. 10A and 10B are cross-sectional views each illustrating a semiconductor light-emitting device according to example embodiments.

Most components included in semiconductor light-emitting devices 70 and 80 described below and descriptions thereof are substantially identical or similar to the components and descriptions given with reference to FIGS. 9A to 9C. Thus, differences from the semiconductor light-emitting device 60 described above will be mainly described.

Referring to FIG. 10A, the semiconductor light-emitting device 70 having multiple pixels 100 is illustrated, the semiconductor light-emitting device 70 including the substrate 110, the plurality of light-emitting structures 120, the plurality of first electrodes 130, the first insulating layer 141 and the second insulating layer 143, a second electrode 150A, and the plurality of optical layers 160.

In the semiconductor light-emitting device 70, the second electrode 150A may be arranged to cover the side and upper surfaces of each light-emitting structure 120. The second electrode 150A may be electrically connected to the second semiconductor layer 122. In some example embodiments, the second electrode 150A may directly contact the uppermost surface 122T of the second semiconductor layer 122. In some example embodiments, the second electrode 150A may include a metal material having high reflectivity, and thus function as a reflective electrode.

The second electrode 150A may include a second upper portion 151A and a second lower portion 153A. In some example embodiments, the second upper portion 151A may directly contact the second lower portion 153A. The second lower portion 153A may penetrate the substrate 110, one end of the second lower portion 153A may be connected to the second upper portion 151A, and the other end of the second lower portion 153A may be exposed at the lower surface of the substrate 110. That is, the second lower portion 153A may extend in the direction (Z direction) perpendicular to the upper surface of the substrate 110.

The second lower portion 153A may function as a common electrode of the multiple pixels 100 included in the semiconductor light-emitting device 70. Although FIG. 10A illustrates that the semiconductor light-emitting device 70 includes one second lower portion 153A as the common electrode, the number of common electrodes included in the semiconductor light-emitting device 70 is not limited thereto. In addition, the second lower portion 153A may be arranged between the multiple pixels 100 included in the semiconductor light-emitting device 70.

Referring to FIG. 10B, the semiconductor light-emitting device 80 having multiple pixels 100 is illustrated, the semiconductor light-emitting device 80 including the substrate 110, the plurality of light-emitting structures 120, the plurality of first electrodes 130, the first insulating layer 141 and the second insulating layer 143, a second electrode 150B, and the plurality of optical layers 160.

In the semiconductor light-emitting device 80, the second electrode 150B may be arranged to cover the side and upper surfaces of each light-emitting structure 120. The second electrode 150B may be electrically connected to the second semiconductor layer 122. In some example embodiments, the second electrode 150B may directly contact the uppermost surface 122T of the second semiconductor layer 122. In some example embodiments, the second electrode 150B may include a metal material having high reflectivity, and thus function as a reflective electrode.

The second electrode 150B may include a first portion 151B and a second portion 153B. In some example embodiments, the first portion 151B may directly contact the second portion 153B. The second portion 153B may not penetrate the substrate 110, and one end of the second portion 153B may be connected to the first portion 151B. That is, the second portion 153B may extend in a third direction (Z direction) perpendicular to the upper surface of the substrate 110.

The second portion 153B may function as a common electrode of the multiple pixels 100 included in the semiconductor light-emitting device 80. Although FIG. 10B illustrates that the semiconductor light-emitting device 80 includes one second portion 153B as the common electrode, the number of common electrodes included in the semiconductor light-emitting device 80 is not limited thereto. In addition, the second portion 153B may be arranged outside the multiple pixels 100 included in the semiconductor light-emitting device 80.

FIG. 11 is a flowchart illustrating sequential processes of a method of manufacturing a semiconductor light-emitting device according to an example embodiment.

Referring to FIG. 11, a method S10 of manufacturing a semiconductor light-emitting device may include sequential processes as follows.

According to the example embodiment, the method S10 of manufacturing a semiconductor light-emitting device includes a first operation S110 of sequentially forming a second preliminary semiconductor layer, a preliminary active layer, and a first preliminary semiconductor layer on a growth substrate in this stated order, a second operation S120 of forming a first upper portion of a first electrode and a first insulating layer on the first preliminary semiconductor layer, a third operation S130 of bonding a substrate onto the first insulating layer and removing the growth substrate, a fourth operation S140 of etching the second preliminary semiconductor layer, the preliminary active layer, and the first preliminary semiconductor layer to be separated into a plurality of light-emitting structures, a fifth operation S150 of forming a groove to a certain depth in a second semiconductor layer, a sixth operation S160 of forming a second insulating layer on side surfaces of the plurality of light-emitting structures and an upper surface of the first insulating layer, a seventh operation S170 of forming a second upper portion of a second electrode on a side surface of the second insulating layer and an uppermost surface of the second semiconductor layer, a eighth operation S180 of forming an optical layer in the groove of the second semiconductor layer, and a ninth operation S190 of forming the first and second electrodes.

Here, processes may be performed in a different order from a specific order that is described. For example, two processes described as being consecutively performed may be substantially simultaneously performed or may be performed in an opposite order to a described order.

Descriptions of the first operation S110 to the ninth operation S190 will be described below in detail with reference to FIGS. 12 to 20.

FIGS. 12 to 20 are cross-sectional views respectively illustrating sequential processes of a method of manufacturing a semiconductor light-emitting device according to an example embodiment.

Figure 12:
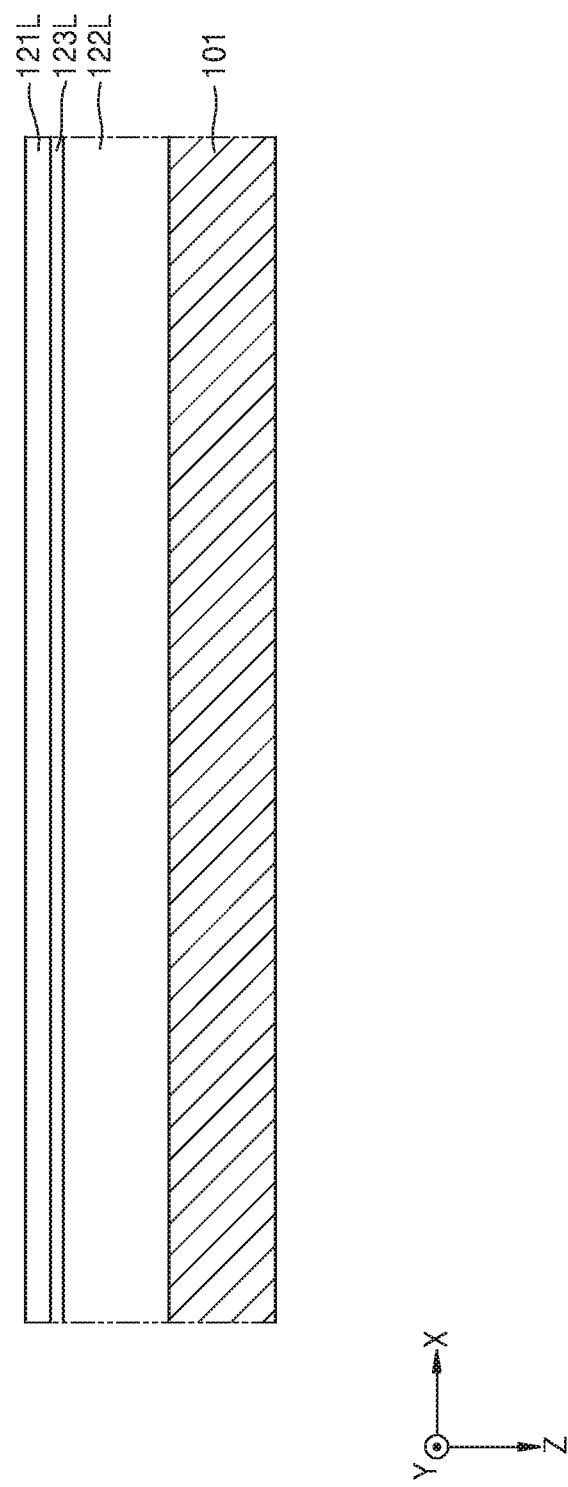
FIGS. 12, 13, 14, 15, 16, 17, 18, 19, and 20 are cross-sectional views respectively illustrating sequential processes of a method of manufacturing a semiconductor light-emitting device according to an example embodiment.

Referring to FIG. 12, a second preliminary semiconductor layer 122L, a preliminary active layer 123L, and a first preliminary semiconductor layer 121L are sequentially formed on a growth substrate 101, in this stated order.

The growth substrate 101 may include an insulating substrate, a conductive substrate, or a semiconductor substrate. For example, a material included in the growth substrate 101 may include, but is not limited to, sapphire ($Al_2O_3$), gallium nitride (GaN), silicon (Si), germanium (Ge), gallium arsenide (GaAs), zinc oxide (ZnO), silicon germanium (SiGe), silicon carbide (SiC), gallium oxide ($Ga_2O_3$), lithium gallium oxide ($LiGaO_2$), lithium aluminum oxide ($LiAlO_2$), magnesium aluminum oxide ($MgAl_2O_4$), or the like.

The second preliminary semiconductor layer 122L, the preliminary active layer 123L, and the first preliminary semiconductor layer 121L are sequentially formed on the growth substrate 101, in this stated order. Here, the thickness of the second preliminary semiconductor layer 122L may be greater than the thickness of the preliminary active layer 123L or the thickness of the first preliminary semiconductor layer 121L.

Each of the second preliminary semiconductor layer 122L, the preliminary active layer 123L, and the first preliminary semiconductor layer 121L may be formed by epitaxial growth. Because these components have been described in detail with reference to FIGS. 3A to 3C, repeated descriptions thereof will be omitted.

Figure 13:
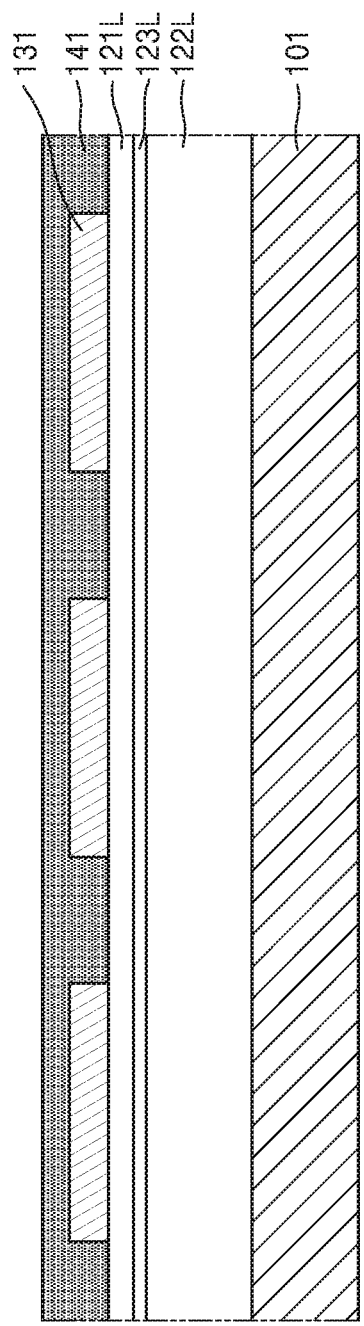

Referring to FIG. 13, the first upper portion 131 and the first insulating layer 141 are formed on the first preliminary semiconductor layer 121L.

To form the first upper portion 131, a first material layer is formed first on the first preliminary semiconductor layer 121L. The first material layer may include, for example, Ag, Al, Ni, Cr, Cu, Au, Pd, Pt, Sn, W, Rh, Ir, Ru, Mg, Zn, or the like. The first material layer may be formed by a process such as chemical vapor deposition (CVD), physical vapor deposition (PVD), or atomic layer deposition (ALD).

Next, a mask for patterning is formed on the first material layer. The mask may include a hard mask or a photoresist. The first upper portion 131 may be formed by etching the first material layer by using the mask as an etch mask. In some example embodiments, the first upper portion 131 may be formed by a lift-off process.

Next, the first insulating layer 141 may be formed to cover the first upper portion 131. Because the first insulating layer 141 has been described in detail with reference to FIGS. 3A to 3C, repeated descriptions thereof will be omitted. In some example embodiments, the first insulating layer 141 may include silicon oxide, which may be formed by performing spin-coating on spin-on-glass (SoG) and then curing the SoG. In other example embodiments, the first insulating layer 141 may be formed by a CVD, PVD, or ALD process.

Figure 14:
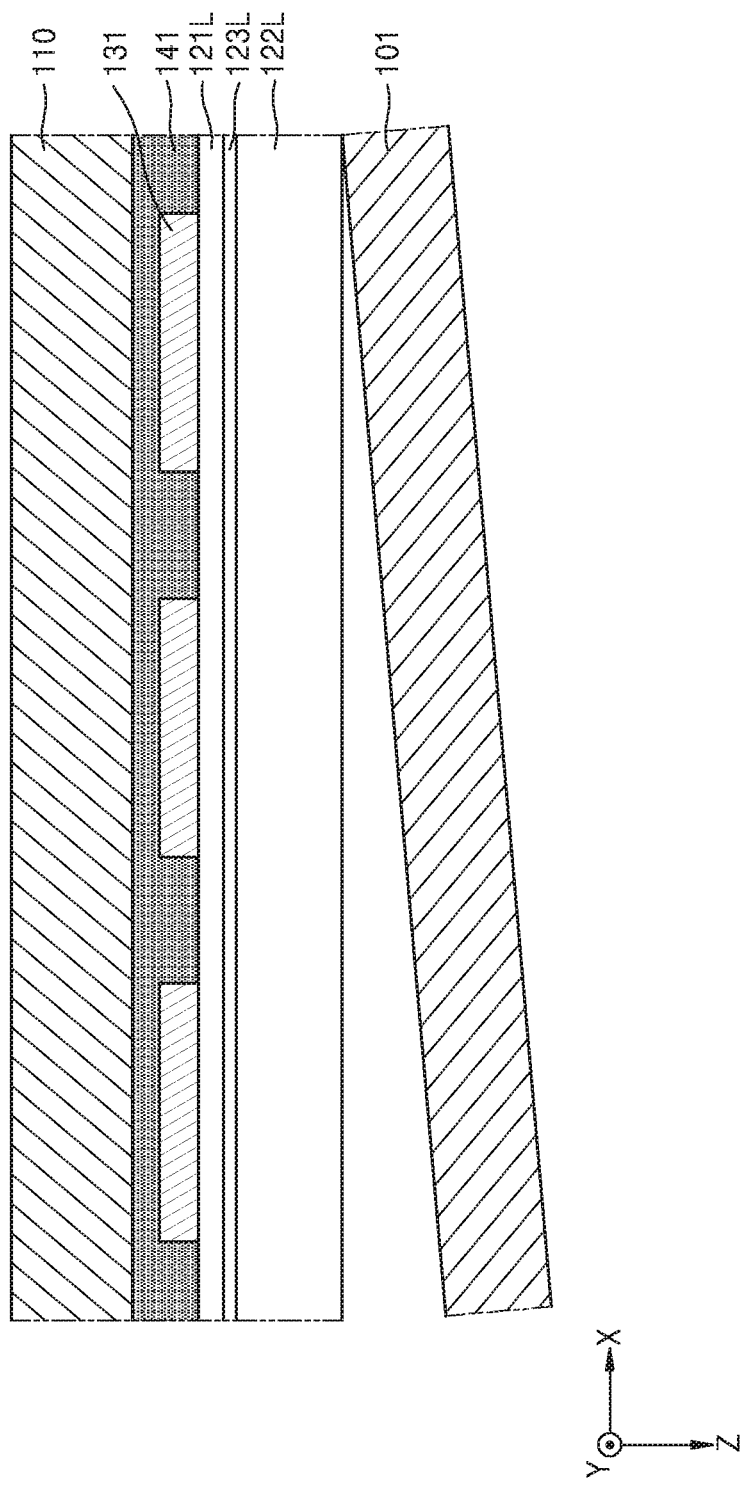

Referring to FIG. 14, the substrate 110 is bonded onto the first insulating layer 141.

The substrate 110 may include a sapphire ($Al_2O_3$) substrate, a silicon (Si) substrate, or the like. The substrate 110 may have light transmitting properties. In this case, the substrate 110 may include a light transmitting material or include a material that may have light transmitting properties when the material is formed to a certain thickness or less.

To bond the substrate 110 onto the first insulating layer 141, a bonding material may be used as a mediator between the substrate 110 and the first insulating layer 141. The bonding material may include SoG, a polymer, or the like.

Next, the growth substrate 101 is removed from the second preliminary semiconductor layer 122L. For example, laser beams may be irradiated onto the growth substrate 101 to cause a thermal reaction between the growth substrate 101 and the second preliminary semiconductor layer 122L, thereby causing material separation. Alternatively, the growth substrate 101 may be removed from the second preliminary semiconductor layer 122L by performing a physical polishing process on the growth substrate 101 or by performing dry etching on the growth substrate 101. Alternatively, the growth substrate 101 may be removed by performing chemical etching on the growth substrate 101.

Figure 15:
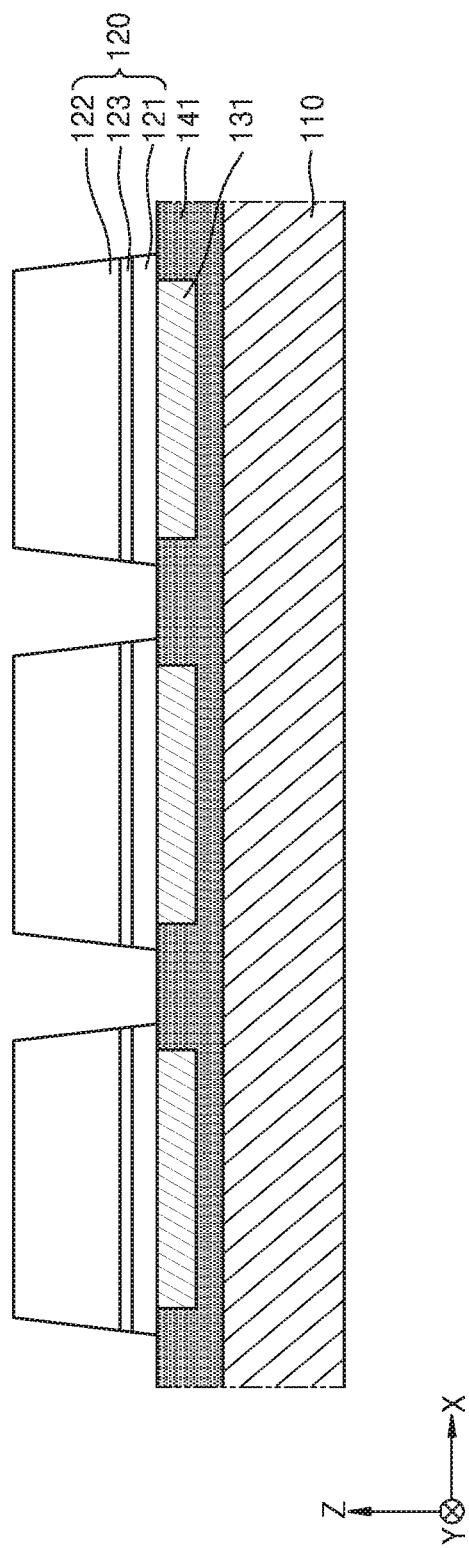

Referring to FIG. 15, the second preliminary semiconductor layer 122L (see FIG. 14), the preliminary active layer 123L (see FIG. 14), and the first preliminary semiconductor layer 121L (see FIG. 14) are etched to be separated into the plurality of light-emitting structures 120.

By forming a mask on the second preliminary semiconductor layer 122L (see FIG. 14) and then performing anisotropic etching, the second preliminary semiconductor layer 122L (see FIG. 14), the preliminary active layer 123L (see FIG. 14), and the first preliminary semiconductor layer 121L (see FIG. 14) may be sequentially etched in this stated order to be separated into the plurality of light-emitting structures 120. As a result of the separation into the plurality of light-emitting structures 120, the first semiconductor layer 121, the active layer 123, and the second semiconductor layer 122, which are included in each light-emitting structure 120, are formed.

In some example embodiments, the anisotropic etching may be performed by using the first insulating layer 141 as an etch stop layer. That is, when the separation into the plurality of light-emitting structures 12 is completed by the anisotropic etching, the upper surface of the first insulating layer 141 may be partially exposed.

Because the thickness of the second semiconductor layer 122 is greater than the thickness of the first semiconductor layer 121 in a direction perpendicular to the substrate 110, the active layer 123 may receive significantly low damage during the anisotropic etching.

Figure 16:
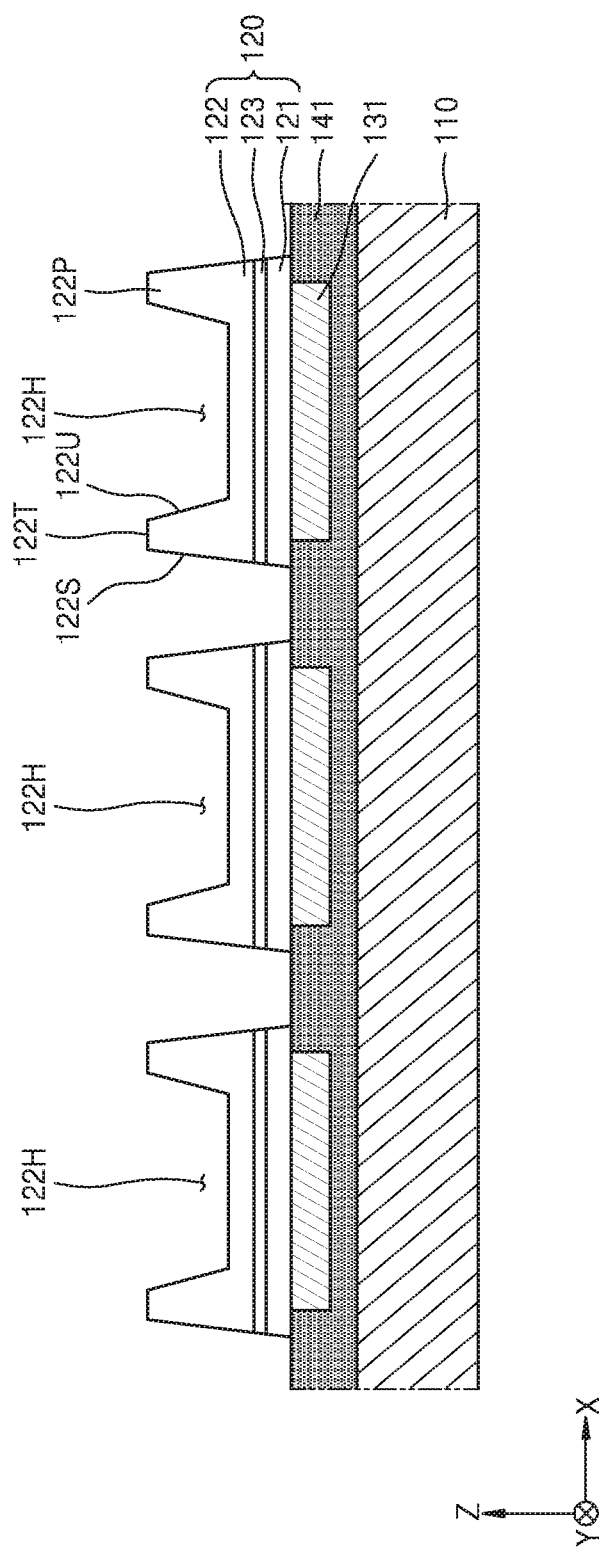

Referring to FIG. 16, the groove 122H is formed to a certain depth by etching a central portion of the second semiconductor layer 122.

The groove 122H having a certain depth is formed by forming a mask on the second semiconductor layer 122 and then performing anisotropic etching. As a result of forming the groove 122H, the second semiconductor layer 122 may have the protrusion structure 122P surrounding the groove 122H, and the outer side surface 122S, the uppermost surface 122T, and the inner side surface 122U of the second semiconductor layer 122 may be defined.

Figure 17:
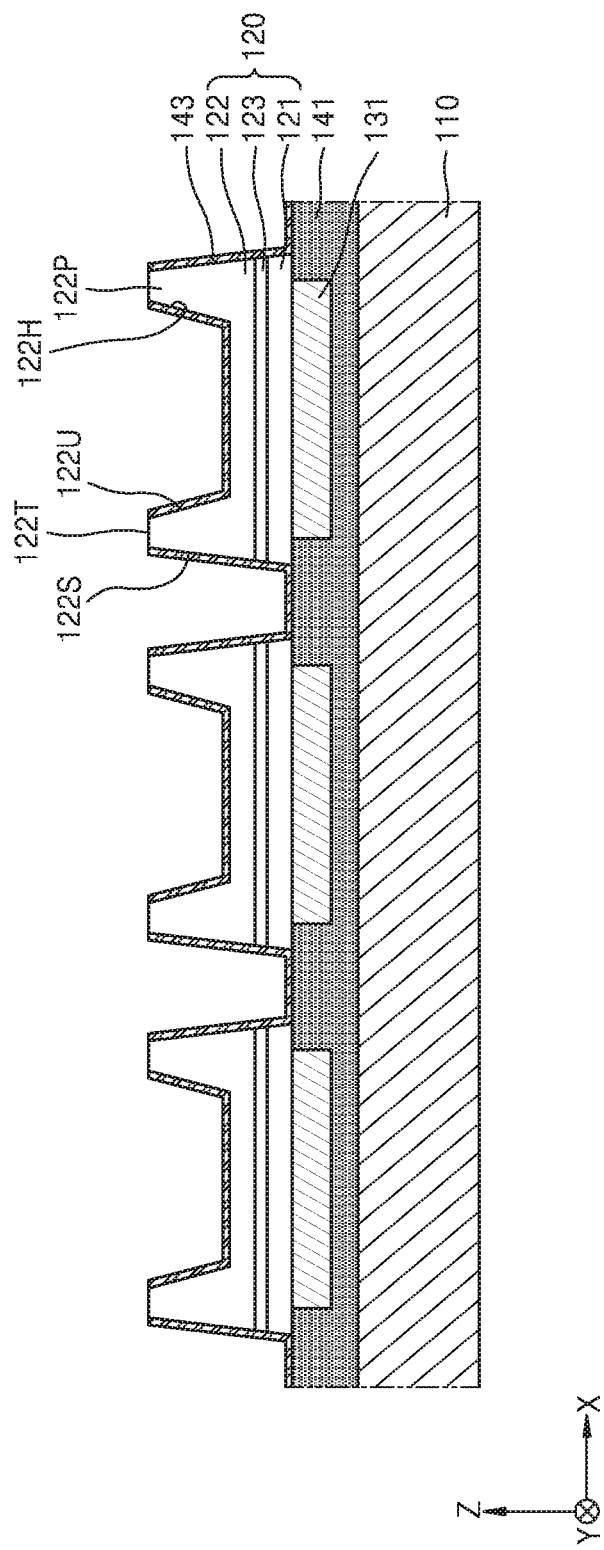

Referring to FIG. 17, the second insulating layer 143 is formed on the side surfaces of the plurality of light-emitting structures 120 and the upper surface of the first insulating layer 141.

The second insulating layer 143 is formed to include a region exposing the uppermost surface 122T of the second semiconductor layer 122. The second insulating layer 143 may be formed by, for example, a CVD, PVD, or ALD process. Because the second insulating layer 143 has been described in detail with reference to FIGS. 3A to 3C, repeated descriptions thereof will be omitted.

Specifically, to form the second insulating layer 143, an insulating material layer is conformally formed first on the plurality of light-emitting structures 120. The insulating material layer may be formed by a CVD, PVD, or ALD process. Next, a mask for patterning is formed on the insulating material layer. The mask may include a hard mask or a photoresist. By etching the insulating material layer by using the mask as an etch mask, the second insulating layer 143 may be formed to expose the uppermost surface 122T of the second semiconductor layer 122.

Figure 18:
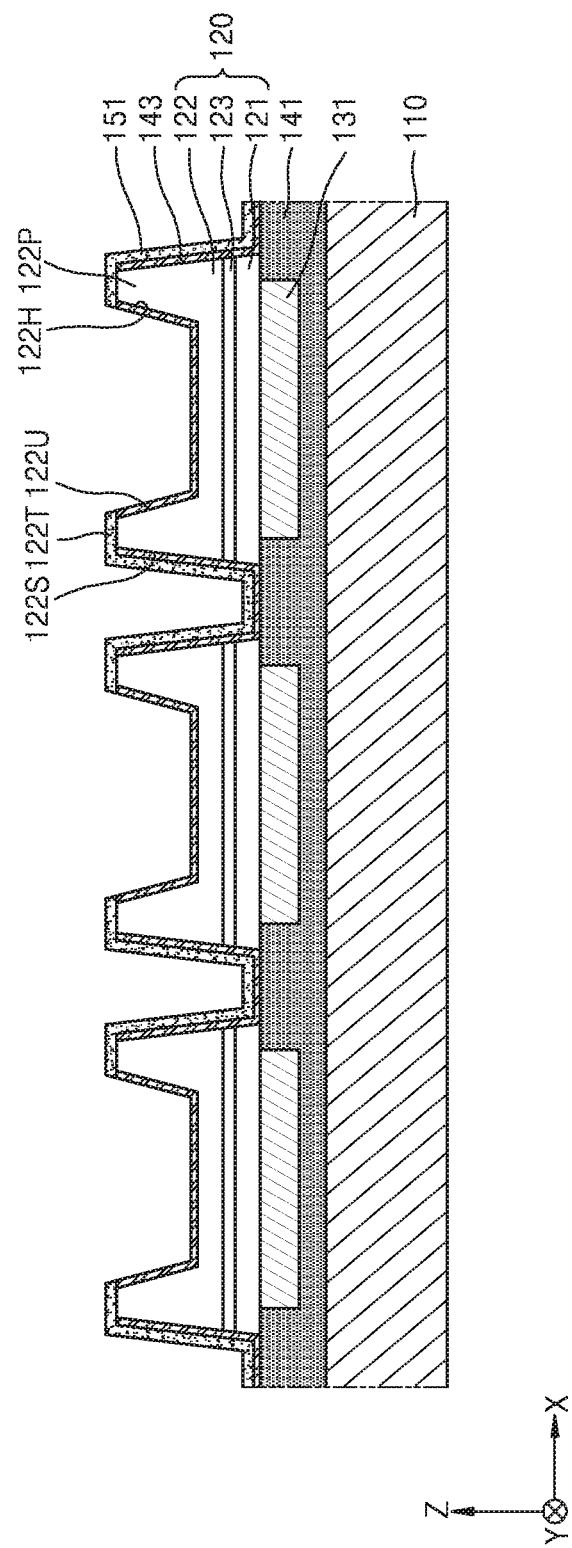

Referring to FIG. 18, the second upper portion 151 is formed on the side surface of the second insulating layer 143 and the uppermost surface 122T of the second semiconductor layer 122.

To form the second upper portion 151, a second material layer is formed first on an entire surface of the second insulating layer 143 and the uppermost surface 122T of the second semiconductor layer 122. The second material layer may include, for example, Ag, Al, Ni, Cr, Cu, Au, Pd, Pt, Sn, W, Rh, Ir, Ru, Mg, Zn, or the like. The second material layer may be formed by a CVD, PVD, or ALD process.

Next, a mask for patterning is formed on the second material layer. The mask may include a hard mask or a photoresist. By etching the second material layer by using the mask as an etch mask, the second upper portion 151 may be formed.

The second upper portion 151 may be formed to be electrically connected to the uppermost surface 122T of the second semiconductor layer 122, the uppermost surface 122T being exposed by the second insulating layer 143. The second upper portion 151 contacts the second semiconductor layer 122 and thus may function as the second electrode 150 (see FIG.

Figure 19:
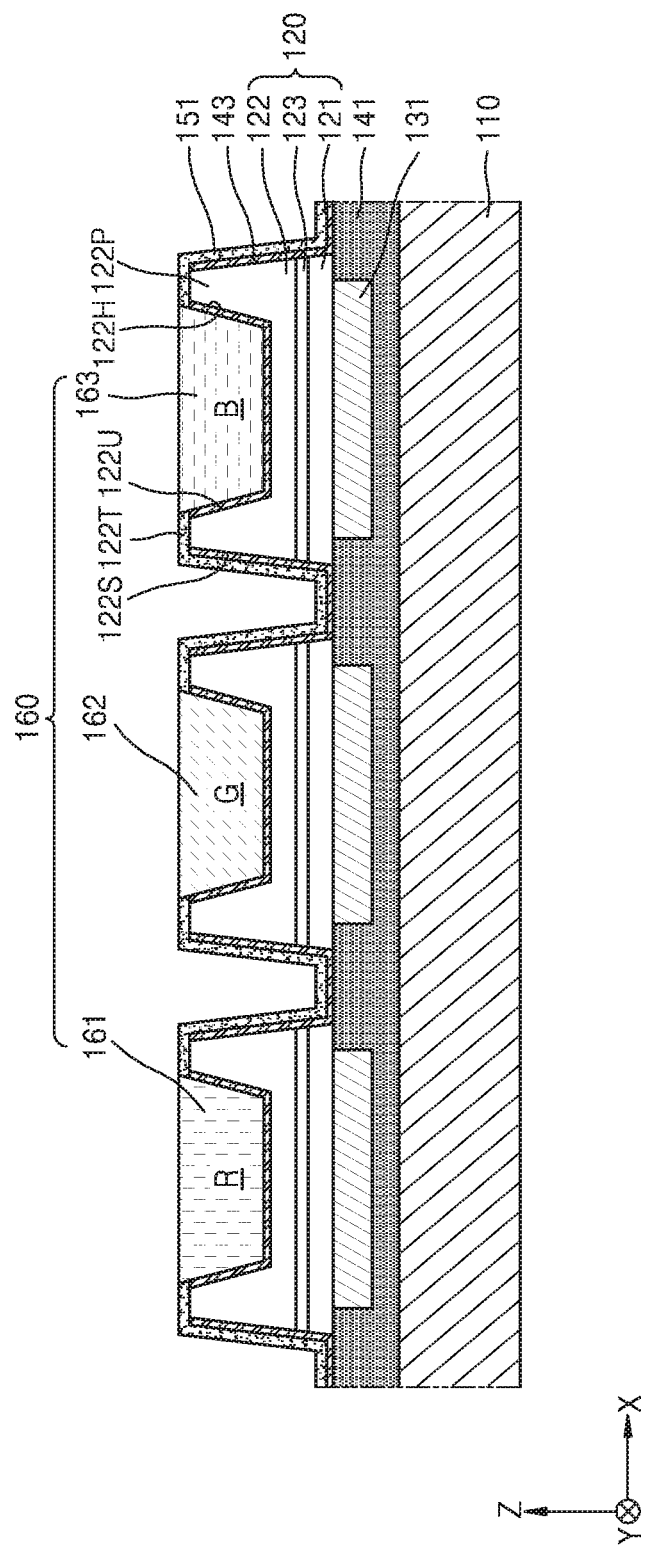

Referring to FIG. 19, each of the plurality of optical layers 160 fills the groove 122H of the second semiconductor layer 122, the groove 122H being defined by the protrusion structure 122P.

Each of the first optical layer 161, the second optical layer 162, and the third optical layer 163 may be formed to fill the groove 122H of the second semiconductor layer 122. For example, each of the first optical layer 161, the second optical layer 162, and the third optical layer 163 may be confined within the light-emitting structure 120 by the protrusion structure 122P of the second semiconductor layer 122. Because the first optical layer 161, the second optical layer 162, and the third optical layer 163 have been described in detail with reference to FIGS. 3A to 3C, repeated descriptions thereof will be omitted.

The second insulating layer 143 may be arranged between the second semiconductor layer 122 and each of the first optical layer 161, the second optical layer 162, and the third optical layer 163. The level of the uppermost surface of each of the first optical layer 161, the second optical layer 162, and the third optical layer 163 may be substantially the same as the level of the uppermost surface of the second electrode 150. Accordingly, each of the first optical layer 161, the second optical layer 162, and the third optical layer 163 may directly contact the second electrode 150 and the second insulating layer 143.

Figure 20:
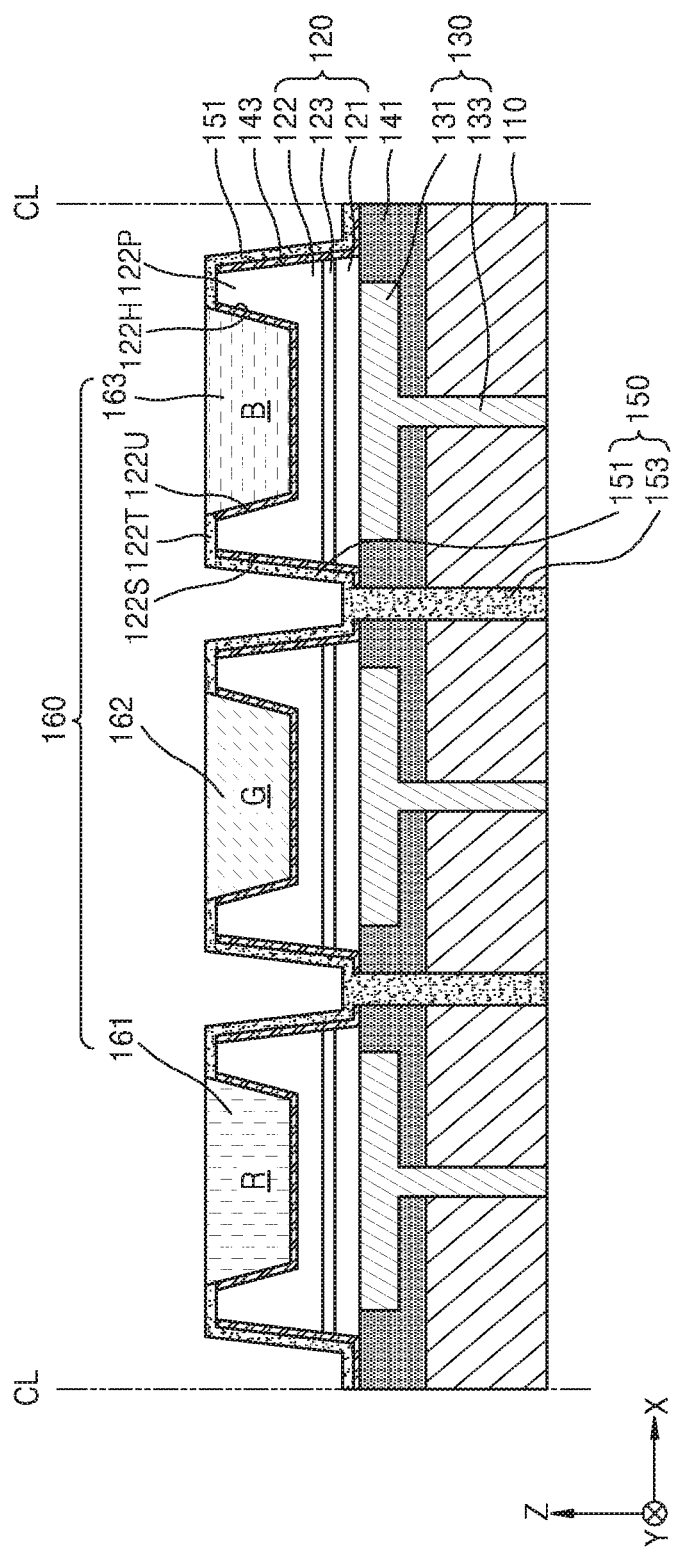

Referring to FIG. 20, the first electrode 130 is formed by connecting the first upper portion 131 to the first lower portion 133, and the second electrode 150 is formed by connecting the second upper portion 151 to the second lower portion 153.

To form the first lower portion 133 and the second lower portion 153 to penetrate the substrate 110 and the first insulating layer 141, a mask is formed first on the lower surface of the substrate 110. The substrate 110 and the first insulating layer 141 are penetrated by using the mask as an etch mask, thereby forming a through-hole to expose the first upper portion 131 and the second upper portion 151. Next, by forming a seed layer and performing a plating process, the first lower portion 133 and the second lower portion 153 may be formed to fill the through-hole.

Accordingly, the first electrode 130 may be formed by connecting the first upper portion 131 to the first lower portion 133, and the second electrode 150 may be formed by connecting the second upper portion 151 to the second lower portion 153.

Next, the substrate 110 and various material layers are cut along a cutting line CL to be physically separated into the individual semiconductor light-emitting devices 10 (see FIG. 3C).

In this way, the semiconductor light-emitting device 10 (see FIG. 3C) according to the example embodiment may be manufactured, the semiconductor light-emitting device 10 including the substrate 110, the plurality of light-emitting structures 120, the plurality of first electrodes 130, the first insulating layer 141 and the second insulating layer 143, the second electrode 150, and the plurality of optical layers 160.

While example embodiments have been shown and described with reference to the figures, it will be understood that various changes in form and details may be made therein without departing from the spirit and scope of the following claims.

What is claimed is:

1. A semiconductor light-emitting device comprising:
    a substrate having an upper surface and a lower surface;
    a first insulating layer disposed on the upper surface of the substrate;
    a plurality of light-emitting structures disposed on the first insulating layer and spaced apart from each other, each of the plurality of light-emitting structures comprising a first semiconductor layer, an active layer, and a second semiconductor layer;
    a plurality of optical layers, each filling a groove that is formed in an upper surface of the second semiconductor layer of each of the plurality of light-emitting structures;
    a plurality of first electrodes penetrating the substrate and electrically connected to the first semiconductor layer of each of the plurality of light-emitting structures, respectively;
    a plurality of second insulating layers disposed on side surfaces of each of the plurality of light-emitting structures, respectively; and
    a second electrode connected to the plurality of light-emitting structures, the second electrode being disposed on the second semiconductor layer of each of the plurality of light-emitting structures and each of the plurality of second insulating layers, wherein, in a plan view, a planar area of each of the plurality of optical layers is less than a planar area of each corresponding first electrode, and wherein, in a side cross-sectional view, a maximum width of the first semiconductor layer is less than a maximum width of each corresponding first electrode.

2. The semiconductor light-emitting device of claim 1, wherein an uppermost surface of the second semiconductor layer of each of the plurality of light-emitting structures contacts the second electrode and is electrically connected to the second electrode, and wherein a level of an uppermost surface of the second electrode is same as a level of an uppermost surface of each of the plurality of optical layers.

3. The semiconductor light-emitting device of claim 1, wherein the second semiconductor layer of each of the plurality of light-emitting structures has a protrusion structure surrounding the groove, and wherein the protrusion structure has an increasing width toward the substrate.

4. The semiconductor light-emitting device of claim 3, wherein, in a side cross-sectional view, each of the plurality of optical layers has a reversed trapezoidal shape.

5. The semiconductor light-emitting device of claim 1, wherein the second electrode and each of the plurality of first electrodes comprise a reflective electrode or a transparent electrode.

6. The semiconductor light-emitting device of claim 1, wherein each of the plurality of second insulating layers is disposed between the second semiconductor layer and each of the plurality of optical layers.

7. The semiconductor light-emitting device of claim 6, wherein each of the plurality of optical layers contacts the second electrode and each of the plurality of second insulating layers.

8. The semiconductor light-emitting device of claim 1, wherein each of the plurality of optical layers contacts the second semiconductor layer.

9. The semiconductor light-emitting device of claim 1, wherein each of the plurality of optical layers comprises:
a material configured to convert a wavelength of light emitted from each of the plurality of light-emitting structures into a different wavelength; or
a transparent material configured to transmit light emitted from each of the plurality of light-emitting structures.

10. The semiconductor light-emitting device of claim 1, wherein the first semiconductor layer comprises a semiconductor layer doped with p-type impurities, and wherein the second semiconductor layer comprises a semiconductor layer doped with n-type impurities.

11. The semiconductor light-emitting device of claim 1, wherein a portion of the second electrode penetrates the substrate, and wherein the second electrode and each of the plurality of first electrodes are partially exposed at the lower surface of the substrate.

12. The semiconductor light-emitting device of claim 1, further comprising a transparent protective layer disposed on an upper surface of each of the plurality of optical layers.

13. The semiconductor light-emitting device of claim 1, further comprising a transparent protective layer disposed on the second electrode and all of the plurality of optical layers.

14. A semiconductor light-emitting device comprising:
a substrate having an upper surface and a lower surface;
a first insulating layer disposed on the upper surface of the substrate;
3N light-emitting structures disposed on the first insulating layer and spaced apart from each other, where N is an integer of 2 or more, each of the 3N light-emitting structures comprising a first semiconductor layer, an active layer, and a second semiconductor layer;
3N optical layers each filling a groove that is formed at a certain depth in the second semiconductor layer of each of the 3N light-emitting structure;
3N first electrodes penetrating the substrate and electrically connected to the first semiconductor layer of each of the 3N light-emitting structures, respectively;
a plurality of second insulating layers disposed on side surfaces of each of the 3N light-emitting structures, respectively; and
a second electrode connected to the 3N light-emitting structures, the second electrode being disposed on an uppermost surface of the second semiconductor layer of each of the 3N light-emitting structures and each of the plurality of second insulating layers,
wherein the second electrode comprises an upper portion disposed on the first insulating layer and a lower portion penetrating the substrate and connected to the upper portion,
wherein the lower portion of the second electrode is disposed between adjacent light emitting structures among the 3N light-emitting structures or disposed outside of the 3N light-emitting structures,
wherein every three light-emitting structures of the 3N light-emitting structures are included in one pixel such that the 3N light-emitting structures form an array of N pixels,
wherein, for each pixel of the array of N pixels, the three light-emitting structures included in the pixel respectively correspond to sub-pixels included in the pixel, and
wherein, for each pixel of the array of pixels, the 3N optical layers included in the pixel comprise materials configured to emit light emitted from a corresponding light-emitting structure as red light, green light, and blue light.

15. The semiconductor light-emitting device of claim 14, wherein the lower portion of the second electrode is provided as a common electrode of the array of N pixels.

16. The semiconductor light-emitting device of claim 14, wherein an uppermost surface of the second semiconductor layer of each of the 3N light-emitting structures is connected to the second electrode, and wherein a level of an uppermost surface of the second electrode is same as levels of uppermost surfaces of the 3N optical layers.

17. A semiconductor light-emitting device comprising:
a substrate having an upper surface and a lower surface;
a first insulating layer disposed on the upper surface of the substrate;
a first light-emitting structure, a second light-emitting structure, and a third light-emitting structure disposed on the first insulating layer and spaced from each other, each of the first light-emitting structure, the second light-emitting structure, and the third light-emitting structure comprising a first semiconductor layer, an active layer, and a second semiconductor layer;
a first optical layer, which fills a groove having a certain depth and comprises a wavelength conversion material configured to convert light into red light, the groove being formed by a protrusion structure of the second semiconductor layer of the first light-emitting structure;

a second optical layer, which fills a groove having a certain depth and comprises a wavelength conversion material configured to convert light into green light, the groove being formed by the protrusion structure of the second semiconductor layer of the second light-emitting structure;

a third optical layer, which fills a groove having a certain depth and comprises a wavelength conversion material configured to convert light into blue light or comprises a transparent material, the groove being formed by the protrusion structure of the second semiconductor layer of the third light-emitting structure;

a plurality of first electrodes penetrating the substrate and electrically connected to the first semiconductor layer of each of the first light-emitting structure, the second light-emitting structure, and the third light-emitting structure;

a plurality of second insulating layers disposed on side surfaces of each of the first light-emitting structure, the second light-emitting structure, and the third light-emitting structure, respectively; and a second electrode penetrating the substrate and connected to the first light-emitting structure, the second light-emitting structure, and the third light-emitting structure, the second electrode disposed on an uppermost surface of the second semiconductor layer of each of the first light-emitting structure, the second light-emitting structure, and the third light-emitting structure and each of the plurality of second insulating layers.

18. The semiconductor light-emitting device of claim 17, wherein, in each of the first light-emitting structure, the second light-emitting structure, and the third light-emitting structure, a first height from a lowermost surface of the first semiconductor layer to a lowermost surface of the groove ranges from 0.5 μm to 9 μm, wherein a second height from the lowermost surface of the first semiconductor layer to an uppermost surface of the second semiconductor layer is 10 μm or less, and wherein the second height is greater than the first height.

19. The semiconductor light-emitting device of claim 17, wherein, in each of the first light-emitting structure, the second light-emitting structure, and the third light-emitting structure, a side surface of the protrusion structure is inclined at an angle of or less with respect to the upper surface of the substrate, and wherein each of the first optical layer, the second optical layer, and the third optical layer has a reversed trapezoidal shape in a side cross-sectional view.

20. The semiconductor light-emitting device of claim 19, wherein a first width of an uppermost surface of the protrusion structure is less than a second width of an uppermost surface of each of the first optical layer, the second optical layer, and the third optical layer.

21. The semiconductor light-emitting device of claim 17, wherein an uppermost surface of the second semiconductor layer contacts the second electrode, and wherein a level of an uppermost surface of the second electrode is same as a level of an uppermost surface of each of the first optical layer, the second optical layer, and the third optical layer.

* * * * *